(12) United States Patent
Brand et al.

(10) Patent No.: US 12,186,887 B2
(45) Date of Patent: Jan. 7, 2025

(54) COLLABORATIVE ROBOT SYSTEM ON A MOBILE CART WITH A CHAMBER DOCKING SYSTEM

(71) Applicant: Lam Research Corporation, Fremont, CA (US)

(72) Inventors: Vitali Brand, Milpitas, CA (US); Kamesh Venkata Gadepally, Campbell, CA (US); Jiawei Zhao, San Jose, CA (US); Dan Marohl, San Jose, CA (US); Niraj Vaghela, San Jose, CA (US); Heng Liu, Pleasanton, CA (US); Alexander James Walker, Tigard, OR (US); Zachary Jake Blum, San Francisco, CA (US); Matthew Christopher Clark, Oakland, CA (US); Jessica Jeana Kim, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 149 days.

(21) Appl. No.: 17/908,235

(22) PCT Filed: Mar. 2, 2021

(86) PCT No.: PCT/US2021/020552
§ 371 (c)(1),
(2) Date: Aug. 30, 2022

(87) PCT Pub. No.: WO2021/178458
PCT Pub. Date: Sep. 10, 2021

(65) Prior Publication Data
US 2024/0009856 A1    Jan. 11, 2024

Related U.S. Application Data

(60) Provisional application No. 62/984,772, filed on Mar. 3, 2020.

(51) Int. Cl.
*B25J 11/00* (2006.01)
*B25J 5/00* (2006.01)
*B25J 9/16* (2006.01)

(52) U.S. Cl.
CPC ........... *B25J 11/0085* (2013.01); *B25J 5/007* (2013.01); *B25J 9/162* (2013.01)

(58) Field of Classification Search
CPC ......... B25J 11/0085; B25J 5/007; B25J 9/162
See application file for complete search history.

(56) References Cited

U.S. PATENT DOCUMENTS

| | | |
|---|---|---|
| 7,039,499 B1 | 5/2006 | Nasr et al. |
| 8,398,355 B2 | 3/2013 | Holtkamp et al. |

(Continued)

OTHER PUBLICATIONS

ISR & Written Opinion PCT/US2021/020552, dated Jun. 9, 2021, 11 pages.

*Primary Examiner* — Zoheb S Imtiaz
(74) *Attorney, Agent, or Firm* — PENILLA IP, APC

(57) ABSTRACT

A robot system for servicing a semiconductor tool includes a cart frame. An arm support frame is fixed to the cart frame and is coupled to a robot arm. An arm frame is connected by hinges to the arm support frame at a first end and to a fixture connect interface at a second end. The fixture connect interface connects to a docking fixture of the semiconductor tool. An arm locking mechanism is attached to the arm support frame for locking the arm frame, when rotated, to an extended position or a folded position. The fixture connect interface connects the cart frame to the semiconductor tool, when the arm frame is locked in the extended position.

27 Claims, 21 Drawing Sheets

(56) References Cited

U.S. PATENT DOCUMENTS

| | | |
|---|---|---|
| 9,862,554 B2 | 1/2018 | Caveney |
| 2010/0024186 A1 | 2/2010 | Bailey, III |
| 2017/0072558 A1* | 3/2017 | Reynolds ............... G05D 1/024 |
| 2019/0152721 A1 | 5/2019 | Xu et al. |
| 2021/0094184 A1* | 4/2021 | Gilchrist ................ B25J 9/0096 |
| 2021/0154837 A1* | 5/2021 | Kishida ................... B25J 9/106 |
| 2022/0063085 A1* | 3/2022 | Chintamani ............. B66F 9/18 |
| 2023/0381967 A1* | 11/2023 | Okada .................... B25J 9/0081 |

* cited by examiner

Arm frame in folded position and disconnected from arm locking mechanism

Arm frame in extended position and connected to arm locking mechanism

Arm frame in out-of-the-way position and disconnected from arm locking mechanism

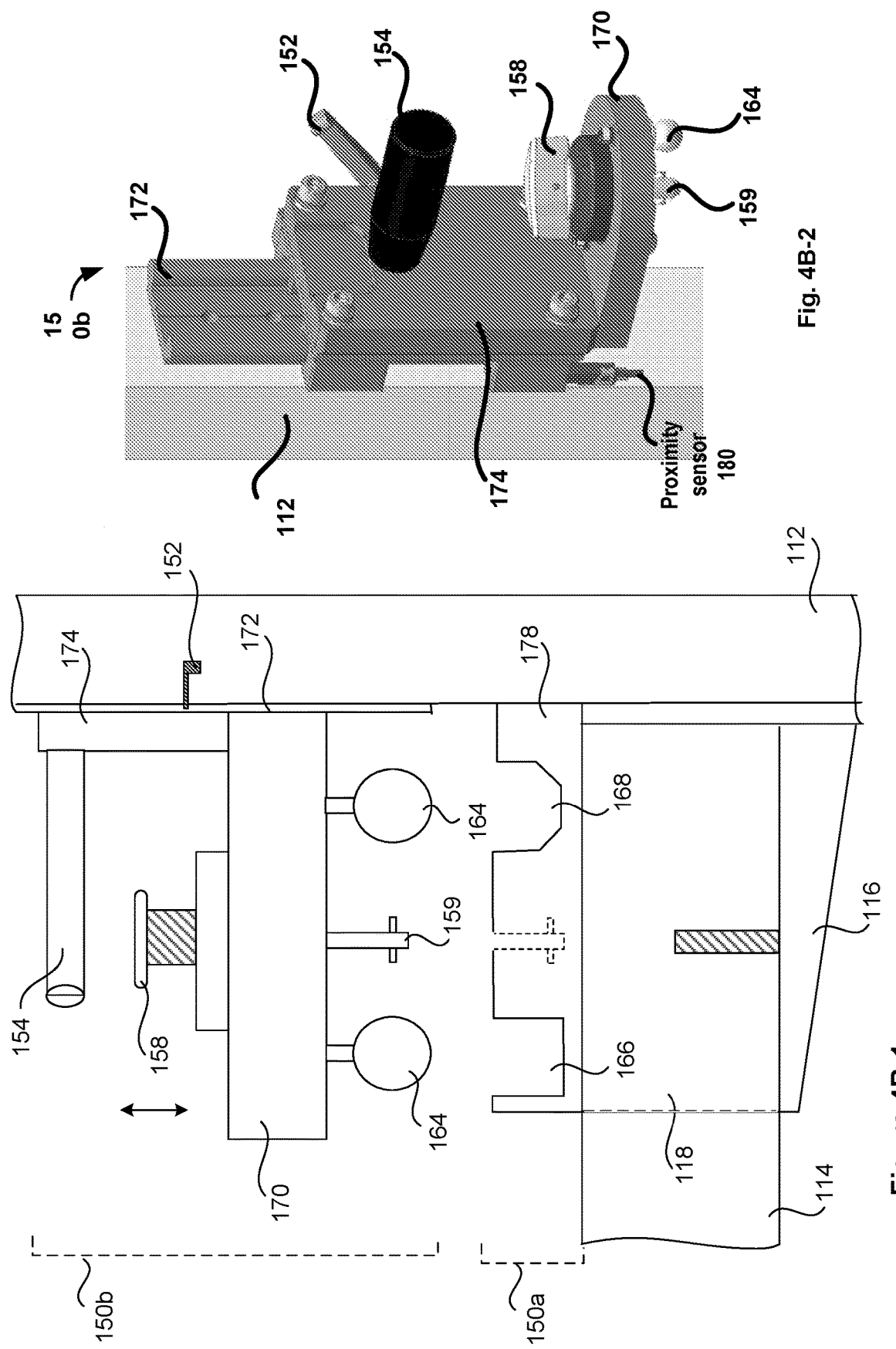

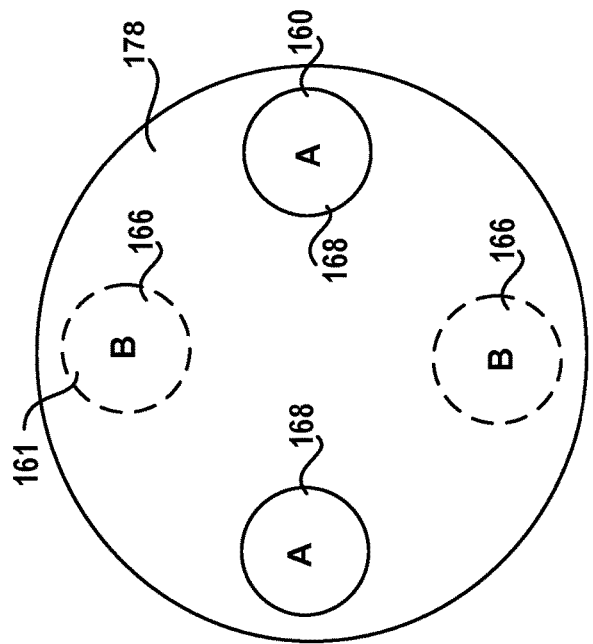
Figure 4C-2
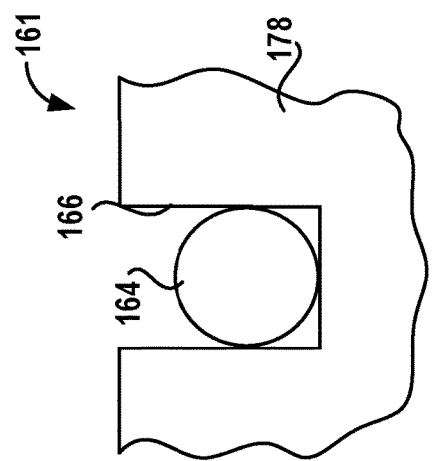
Figure 4C-4
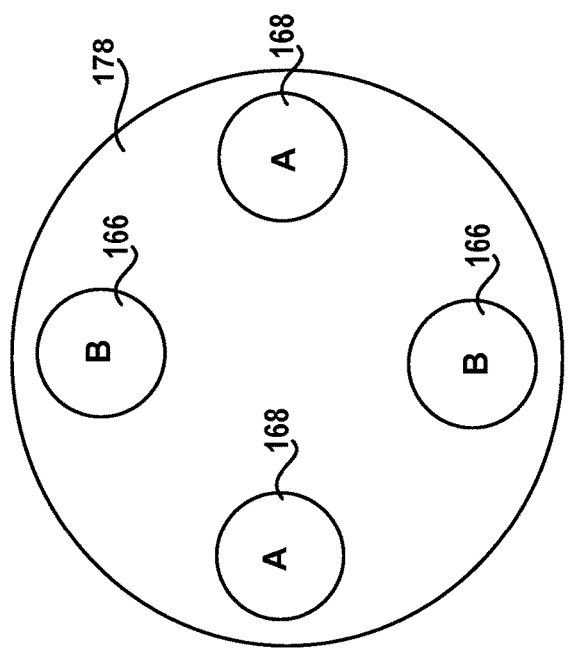
Figure 4C-1
Figure 4C-3

Chamber cleaning end-effector 202
Vacuum nozzle 204
Dry ice blaster nozzle 206
Particle confinement housing 208

Dry ice blaster end-effector path – hoses disconnected

202

Dry ice blaster end-effector path – hoses connected

202

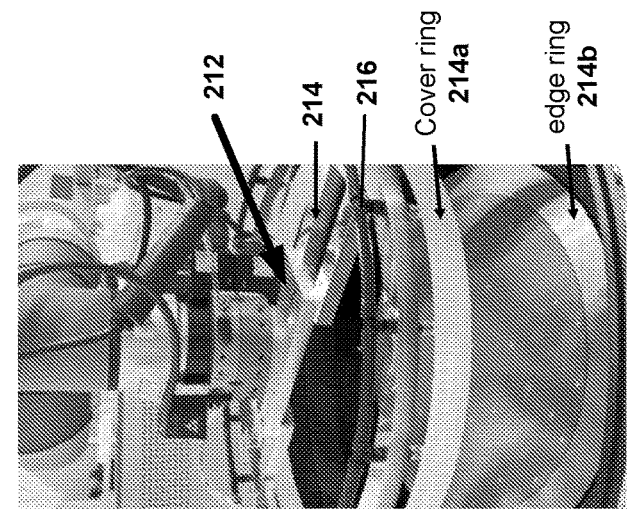
Figure 13B
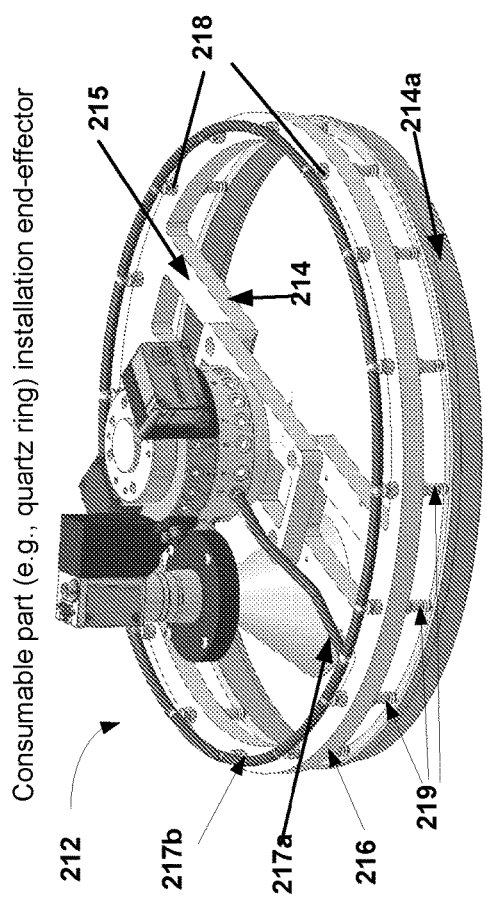
Figure 13A
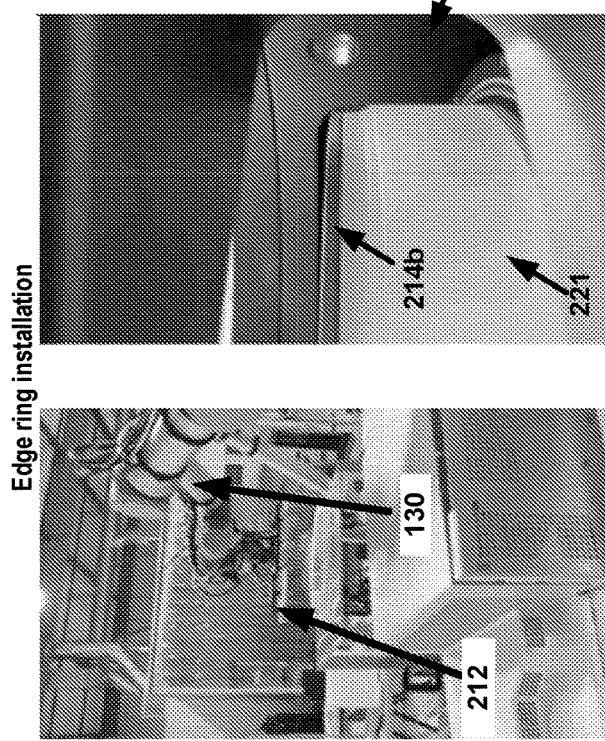
Figure 13D
Figure 13C

Gel Peeling and placement

COLLABORATIVE ROBOT SYSTEM ON A MOBILE CART WITH A CHAMBER DOCKING SYSTEM

CLAIM OF PRIORITY

This application is a national stage filing of and claims priority, under 35 U.S.C. § 371, to PCT/US21/20552, filed on Mar. 2, 2021, and titled "COLLABORATIVE ROBOT SYSTEM ON A MOBILE CART WITH A CHAMBER DOCKING SYSTEM", which claims the benefit of and priority, under 35 U.S.C. § 119(e), to Provisional Patent Application No. 62/984,772, filed on Mar. 3, 2020, and titled "COLLABORATIVE ROBOT SYSTEM ON A MOBILE CART WITH A CHAMBER DOCKING SYSTEM", both of which are incorporated by reference herein in their entirety.

BACKGROUND

1. Field of the Invention

The present embodiments relate to systems and methods for using robots to automate maintenance operations in a semiconductor fabrication facility.

2. Description of the Related Art

A substrate undergoes various fabrication operations in one or more process chambers to generate semiconductor electronic devices. The process modules may be part of a cluster tool and the cluster tool may be part of a fabrication facility. The various fabrication operations may be performed in process modules within a single cluster tool. Alternately, certain ones of the fabrication operations may be performed in process modules of a first cluster tool and other fabrication operations may be performed in process modules of a second cluster tool. The number process modules and the number of cluster tools are used in the device manufacturing process to improve the yield by processing a number of substrates at a time while ensuring that the quality of the electronic devices are consistently maintained. In order to maintain consistency in the quality of electronic devices, the process modules have to undergo frequent maintenance. In some cases, the frequency of maintenance may depend on the hours a process module has been operating and the type of operation performed in the process module. Depending on the hours of operation and the type of operation performed, some of the process modules may need to be serviced more often (e.g., once a month, bi-weekly, daily, after an amount of time or number of operations, etc.,) while other process modules may need to be serviced less often.

Depending on a scale of a fabrication facility used for processing a wafer to generate the electronic devices, there may be hundreds or thousands of the process modules distributed within different cluster tools. As different process modules perform different types of operations, keeping track of the maintenance of the process modules and servicing the many process modules becomes a complex and time consuming process. Currently, the maintenance tracking and servicing of the process modules is done manually by humans Further, certain maintenance operations are very specific and require service personnel to follow specific maintenance patterns. Due to high volume of process modules and frequency of maintenance, these tasks can be repetitive for service personnel. Unfortunately, repetitive tasks by humans are highly prone to human error. For example, some tasks require human service personnel to assemble or disassemble process module systems that have many sub- parts. Unfortunately, even the most highly trained humans get tired or may forget to perform specific tasks in proper order or may perform the tasks out of sequence.

Human error introduced during servicing of process chambers can be correlated to costly and unscheduled equipment downtime. Additionally, performing operations manually using tools (e.g., torque wrenches for tightening bolts) within a confined work space of a fabrication facility requires higher than average physical strength.

Furthermore, some service routines require personnel to take measurements during equipment install and maintenance. Trained personnel typically take measurements using expensive custom-built gauges. However, accuracy of such measurements is not only dependent on the gauge resolution but also on the skill level of the operator. Thus, these measurement operations are also susceptible to human error.

For example, a routine maintenance operation performed by an operator is the cleaning of an inside of a process module. The cleaning operation is performed by vigorously scrubbing the inside sidewalls of the process module to release polymeric deposits adhering to the sidewalls and then cleaning up the released particulates using wipes soaked in solvents. This is a labor intensive and time-consuming operation. Furthermore, cleaning is process module specific as are chemistries used in the process module. Additionally, cleaning personnel must account for module to module variations in the amount of polymeric deposits adhering to the inner sidewalls. The cleaning process may also be operator specific as what is considered clean may vary from operator to operator. Variations in cleaning may result in excessive particles-on-wafer or process shift due to uncleaned deposit reacting with the plasma during process chamber operation. In a similar manner, inspection of parts prior to installation may vary from operator to operator and will depend on the experience level of the operator. Thus, numerous installations and maintenance applications involve considerable challenges and risks attributed to human variability.

It is in this context that embodiments described in the present disclosure arise.

SUMMARY

The various implementations describe apparatuses, systems and methods for automating routine maintenance operations of the various process modules used in a fabrication facility. The automation is performed using a robot arm disposed on a mobile cart. The automation takes into account human safety, form factor, portability, cleanliness, and customized functionality to perform repeatable actions with high precision and minimal variability. The form factor requirements dictate vibration stability, low center of gravity, mobility, size and maneuverability within confined spaces of the fabrication facility and the robot arm is designed to satisfy these requirements. Data of all operations performed by the robot arm at various process modules within the fabrication facility are captured by the computer associated with the robot arm. The data can be used to intelligently predict maintenance schedule of each process module and any customized maintenance operations including the type and specificity of maintenance operations that need to be performed in the respective process module. The maintenance schedule is predicted by feeding the data collected from the various maintenance operations to an artificial intelligence (AI) algorithm that uses the data to build an AI model for each process module and/or for each process. In simpler instances, the maintenance schedule can be established by just looking at the data. As the robot arm performs additional operations at various process modules, data is collected from such ongoing operations and is used to train the AI model.

The robot arm is programmed to perform maintenance operations at various process modules with precision and consistency that is repeatable and all such operations are recorded for the different process modules to generate maintenance history. Further, the robot arm is equipped with vision systems that are used to identify locations of different components that are to be serviced, and the robot arm is programmatically taught specific actions that need to be performed on different components and specific sequences to follow when performing specific maintenance operations. The maintenance history may include each and every process module visited, each and every operation performed, each and every location the robot traveled in the fabrication facility, each and every image of different components taken by its image capturing devices, orientation of different components, etc., as a function of time. Engaging a robot to perform mundane and repetitive tasks that require a high degree of precision relieves the technicians from performing such operations and instead allows them to focus their time on resolving higher level problems. It also avoids technician introduced errors, reduces time for performing the various maintenance operations, and increases precision of tasks performed on various components of a process module. The precision of tasks is achieved without having to rely on expertise or experience of the technicians. The detailed record keeping of the robot allows for quick diagnosis and correction of a problem as it arises, thereby reducing costly and unscheduled downtime.

In one implementation, a robot system is disclosed. The robot system includes a cart frame. An arm support frame is fixed to the cart frame. The arm support frame is coupled to a robot arm used for servicing a semiconductor tool. An arm frame extends from a first end to a second end. The first end of the arm frame is connected by hinges to the arm support frame and the second end has a fixture connect interface for connecting to a docking fixture of the semiconductor tool. The hinges enable the arm frame to rotate about the arm support frame. An arm locking mechanism is attached to the arm support frame for locking the arm frame when rotated to an extended position or a folded position. The fixture connect interface is configured to align the cart frame to the semiconductor tool when the arm frame is locked in the extended position. The alignment of the cart frame provides for corresponding alignment of the robot arm.

Advantages of providing the robot to perform maintenance operations include performing repetitive tasks with precision, consistency and predictable speed. The maintenance operations may require specific actions to be performed and specific sequences to follow and the robot arm is programmed to follow the specific actions and sequences. All maintenance tasks performed by the robot arm in each process module are recorded as a function of time, thereby creating a maintenance history for each process module. The data captured in the maintenance history can be used for diagnostics, installation, maintenance standardization, and customized predictive maintenance. Interlocks and sensors are provided in the robot system to ensure human safety as well as providing stability to the robot arm when performing the maintenance operations. Vision systems provided in the robot arm may be used to align the cart frame in position relative to the process module and/or align the robot arm with the various components of the process module that are being serviced, validate the accuracy of performed maintenance tasks, run metrology applications, etc. The robot arm is designed to fit into constrained space of a semiconductor tool that includes the process module, to perform the maintenance tasks, making this a versatile solution for performing repetitive tasks with precision and consistency.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4B-1 illustrates a simplified block diagram of the arm locking mechanism that engages with the kinematic mount fixture for locking the arm frame, in one implementation.

FIG. 4B-2 illustrates a close-up view of the arm locking mechanism, in one implementation.

FIGS. 4C-1 through 4C-4 illustrate the orientation of the groove locks defined on the base plate of the kinematic mount fixture used in locking the arm frame in one of an extended position or a folded position, in accordance with one implementation.

FIG. 13A illustrates a consumable part installation end-effector that can be coupled to a robot arm of the robot system and used in installing consumable parts, in accordance with one implementation.

FIG. 13B illustrates a close-up view of the consumable part installation end-effector in action moving a consumable part (e.g., cover ring) using a gripper component toward an inside of a process chamber for installation, in accordance with one implementation.

FIGS. 13C and 13D illustrate the consumable part installation end-effector in use for installing an edge ring in the process chamber, in accordance with one implementation.

DETAILED DESCRIPTION

The following embodiments describe apparatuses, systems and methods for performing maintenance operations on different process modules within a fabrication facility using robots. The automation ensures that precision and consistency of repeatable tasks are maintained while mitigating any operator introduced errors. The automation takes into account human safety, form factor, portability, cleanliness, and customized functionality while ensuring that repeatable actions are performed with high precision and minimal variability. It will be apparent that the present embodiments may be practiced without some or all of these specific details. In other instances, well known operations have not been described in detail in order not to unnecessarily obscure the present embodiments.

Figure 1:
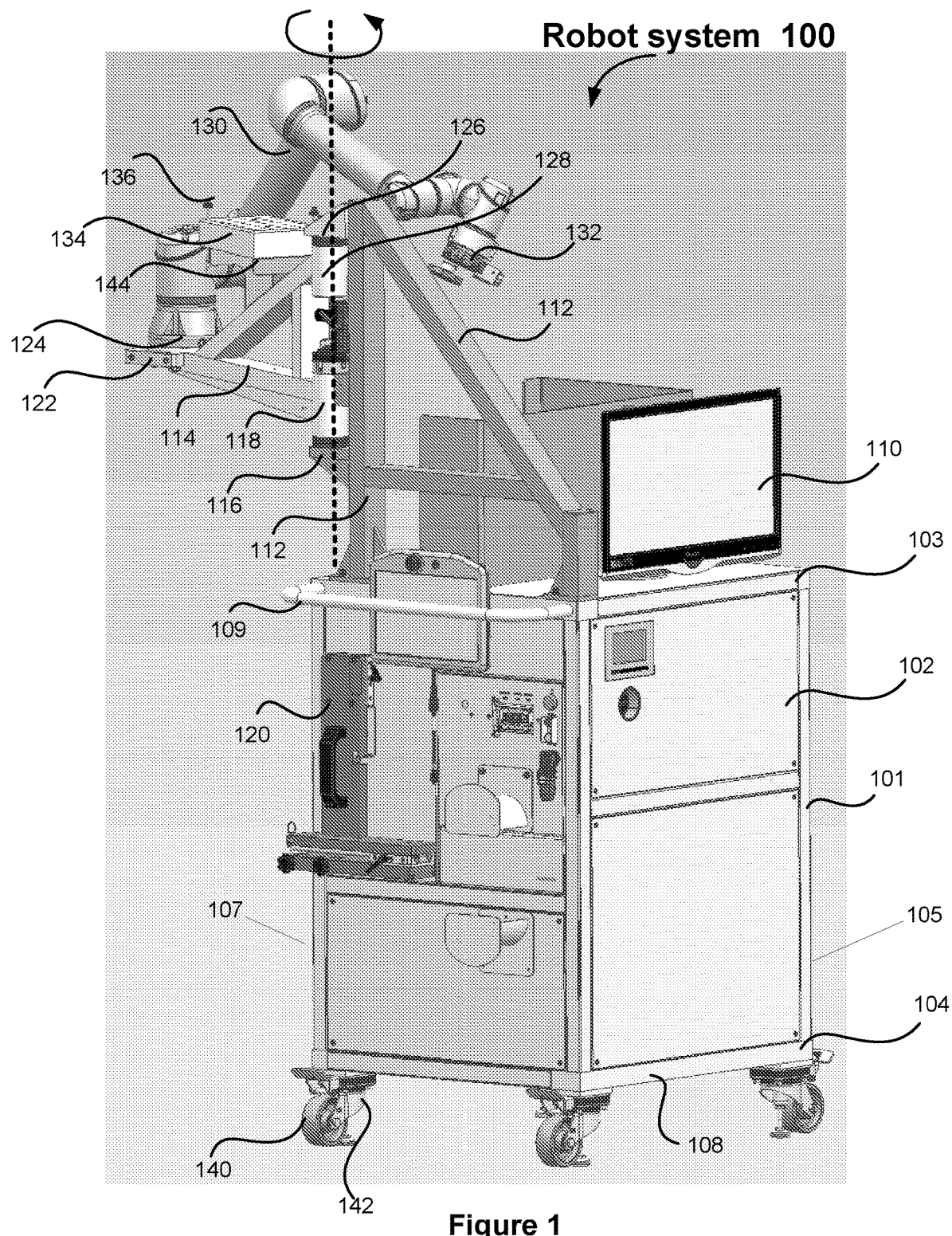
FIG. 1 illustrates an example robot system used in a fabrication facility, in accordance with one implementation.

FIG. 1 illustrates an example of a robot system used in a fabrication facility for performing mundane and routine maintenance tasks within different process modules disposed in the fabrication facility, in one implementation. The robot system 100 includes a robot arm 130 disposed on a mobile cart 101 to allow the robot to be moved within the fabrication facility to service different semiconductor tools. The mobile cart 101 is defined by a cart frame 102 that includes a plurality of sides, including a frame top 103, a frame bottom 104 that is oriented opposite to the frame top 103, and lateral sides that extend between the frame top 103 and the frame bottom 104. The lateral sides include a right side 105, a left side 106, a tool side 107 and a front side 108. The mobility to the mobile cart 101 is provided by a plurality of casters 140 disposed on the frame bottom 104.

The casters 140 are configured to move the mobile cart in different directions. A caster lock 142 is provided on each caster 140 to enable locking the casters 140 when needed, such as when the mobile cart 101 is aligned to a process module (not shown) that is to be serviced. The mobile cart 101 aligns with the semiconductor tool along the tool side 107. In some implementations, the tool side 107 of the mobile cart 101 may include one or more sensors (e.g., lasers, proximity sensors) to detect proximity of the mobile cart 101 to the semiconductor tool and to align the mobile cart 101, when the mobile cart 101 is brought close to the semiconductor tool. The semiconductor tool, in some implementation, may include a chamber with a base in which a plurality of electrical and facility components of the semiconductor tool are integrated, a process module that is disposed over the base, and a top disposed over the process module, wherein the top may include additional facility related components and tools. In alternate implementations, the semiconductor tool may be a cluster tool having a plurality of modules, including a transfer module and one or more process modules that are connected to the transfer module.

The cart frame 102 is configured to house a plurality of component assemblies, such as a computer, a robot controller, an alternate current (AC) power supply, a direct current (DC) power supply to power the computer, the robot controller and other components received in the cart frame 102, a torque controller for providing torque values during installation of one or more components, additional power supply (e.g., uninterruptible power supply—UPS), etc. Location of the various component assemblies within the cart frame 102 may be defined and the component assemblies fixed at specific locations based on the center of gravity of the mobile cart 101, the weights of the components that are used to support the robot arm and the weight and size of the component assemblies. The arrangement of the various component assemblies in the cart frame is to at least partially offset a tipping of the mobile cart 101 due to gravity pull from the robot arm 130, the arm frame 112 and the arm support frame 114, when the robot arm 130 is being engaged in extended position, being moved between the extended position and the folded position, when the cart frame is being moved to align with a process module, or when the cart frame is at rest.

The placement of the various component assemblies within the cart frame 102 also takes into account the shift in the center of gravity of the cart frame 102 when the arm frame 114 is in an extended position. This is to provide stability to the cart frame so that the cart frame does not tip over during movement or use. Additional counter-weights may be provided to ensure that the mobile cart 101 does not tip over during movement, during alignment to the process module, or during use when the arm frame 114 is extended to the extended position. A cover may be provided around the lateral sides of the cart frame 102 to shield the component assemblies received on the cart frame 102. Additional covers or shields may be provided on the frame top 103 to shield some of the components received thereon.

In some implementations, the cart frame 102 may also include a storage handle for storing a docking fixture 120 used to dock the robot system 100 to the semiconductor tool. It should be noted that the docking fixture 120 may be attached to the chamber, or to the frame of the chamber, or any other part of the semiconductor tool, or attached directly to the process module of the semiconductor tool. In these implementations, the docking fixture 120 is a removable component that can be removed from the cart frame 102 and coupled to a rail disposed on an outside sidewall of the process module. Alternately, the docking fixture 120 may be permanently installed on the chamber (e.g., the frame of the chamber or outside sidewall of the process module), in which case the docking fixture 120 is a fixed component.

A display screen 110 is provided on the frame top 103. The display screen 110 may be a touch screen display and may be connected to the computer disposed in the cart frame 102. Alternately or additionally, the display screen 110 may be connected wirelessly to a computer that is located in the fabrication facility or on a cloud system, in some implementations. The display screen 110 may be used to provide inputs to adjust operation parameters of an operation that is to be or is being carried out in a process module using the robot arm 130, and/or to provide any other inputs to drive the robot arm 130, for example. The operation may be part of a service routine that can be carried out in the process module and the computer may be programmable to execute such repeatable service routines. A cart handle 109 is disposed at or near the frame top 103 of the cart frame 102. The cart handle 109 may be used to manually move the robot system 100 around.

An arm support frame 112 is defined on the frame top 103 of the cart frame 102. The arm support frame 112 may be disposed along a lateral side of the frame top 103. In the embodiment illustrated in FIG. 1, the arm support frame 112 is shown to be disposed along the left side edge of the frame top 103 although other lateral sides may also be used. The location of the arm support frame 112 is to ensure that the arm support frame 112 and the arm frame 114 used to support the robot are not in the way of any components disposed on the frame top 103. The arm support frame 112 is coupled to a robot arm 130 that is used for servicing a semiconductor tool. In some implementations, the arm support frame 112 may be an A-frame although other shapes may also be envisioned. The arm support frame 112 includes an arm locking mechanism 151 (not shown). A bottom side of the arm support frame 112 is attached to the frame top 103. In the case where the arm support frame 112 is an A-frame, bottom portion of the two legs of the A-frame are attached at corresponding ends along the lateral side (i.e., left side) edge of the frame top 103, as shown in FIG. 1.

In an alternative embodiment, the arm support frame 112 may be omitted and the arm frame can be connected to the cart frame 102 directly. In this configuration, the cart frame simply has an extension that provides for the connection with the arm frame 114. Further in this configuration, the arm locking mechanism 151 can be connected to a frame portion of the cart frame 102 instead of the arm support frame 112. Accordingly, although the arm support frame and the cart frame are shown as two different pieces they may be combined as one frame, e.g., all part of the cart frame. The arm frame 114 may be connected to the cart frame 102 via hinges that allow radial (i.e., horizontal) movement to the arm frame 114. In this implementation, the cart frame 102 can be extended upward to a height that would allow the arm frame 114 to align with the docking fixture 120 and there is no need for the arm support frame 112.

The arm locking mechanism 151 of the arm support frame 112 is used to connect the arm support frame 112 to an arm frame 114 that supports a robot arm 130. The arm frame 114 extends from a first end to a second end. The first end of the arm frame 114 is connected to the arm support frame 112 by hinges. The second end of the arm frame 114 has a fixture connect interface 122. The fixture connect interface 122 is used to connect the arm frame 114 to a docking fixture 120 of the semiconductor tool (simply referred to herein onward as a "tool"). The docking fixture 120, as noted above, may be directly attached to a chamber of the tool, on the frame of the chamber, or any other part of the tool, or directly on the process module that is part of the tool and is to be serviced by the robot system 100. The hinges enable the arm frame 114 to be rotated radially about the arm support frame 112. The hinges include a bottom hinge 116 (not shown) and a top hinge 126 (not shown). The arm locking mechanism 151 is disposed between the bottom hinge 116 and the top hinge 126. The first end of the arm frame 114 includes a bottom arm rotating pivot 118 attached to a bottom hinge 116 of the arm support frame 112, and a top arm rotating pivot 128 attached to a top hinge 126 of the arm support frame 112.

The arm locking mechanism 151 includes a lower mount fixture and an upper mount fixture. The lower mount fixture is fixed to the bottom arm rotating pivot 118. The upper mount fixture is configured to slide between an engaged position and a disengaged position. In the engaged position, the upper mount fixture is slid down to a low point and in the disengaged position, the upper mount fixture is slid up to a high point. The upper mount fixture includes a slider plate 172 (not shown) that is attached to the arm support frame 112.

A connector plate 174 (not shown) is mounted on to the slider plate 172 and a locking plate 170 (not shown) is connected to the bottom end of the connector plate 174 and is disposed perpendicular to the connector plate 174 extending outward. The slider plate 172 enables the upper mount fixture to be moved down to the engaged position and moved up to disengaged position. A pair of spherical locks is disposed on a bottom surface of the locking plate 170 and is oriented opposite to one another.

In some implementations, a first end of the robot arm 130 includes a robot connect 124 and a second end of the robot arm 130 includes an end-effector connector 132. The robot connect 124, disposed at the first end, connects the robot arm 130 to the fixture connect interface 122. The end-effector connector 132, disposed at the second end, is configured to couple with one or more end-effectors (not shown), wherein each end-effector is designed to perform a specific operation in the process module. In addition to the end-effector connector 132, the second end of the robot arm 130 may include a vision system used for aligning and illuminating the site of operation. The vision system may include a light fixture to illuminate the site within the process module where the operation is to be performed on one or more components, one or more cameras to capture images of the component(s) at various stages of the operation performed on the component(s), one or more sensors and lasers to obtain orientation of the component(s), perform alignment of the robot arm 130, and for inspecting a state and alignment of the component(s) (i.e., on-the-spot metrology parameters).

The vision system and tracking system may further include one or more cameras, motion sensors, gyroscopes for inertial sensor processing, pressure sensors, temperature sensors, speed sensors, torque sensors, power sensors, leveling sensors, and combinations of two or more sensors. The data from the captured images and the metrology parameters obtained from the vision system are recorded and used for validation of the performed tasks, inspection, diagnostics purposes, installation and maintenance standardization and for predictive maintenance.

A second side of the arm frame 114, in some implementation, is configured to include a platform 144. The platform 144 may be made of sheet metal and configured to receive and support different types of part storage modules. The part storage modules may be used to store parts that are used during one or more operations in the process module. For example, the part storage module may be a bolt box 134 that may be used for storing bolts 136 used to install a top plate in an etch module.

Figure 2A:
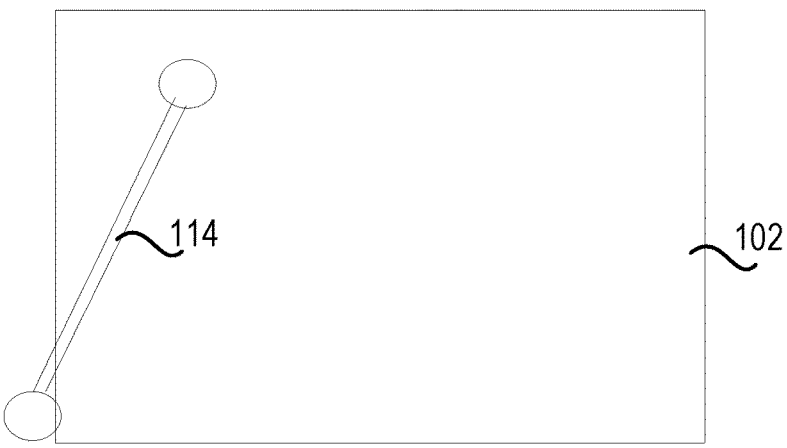
FIGS. 2A-2C illustrate various positions of an arm frame of the robot system during use in the fabrication facility, in accordance with one implementation.
Figure 2B:
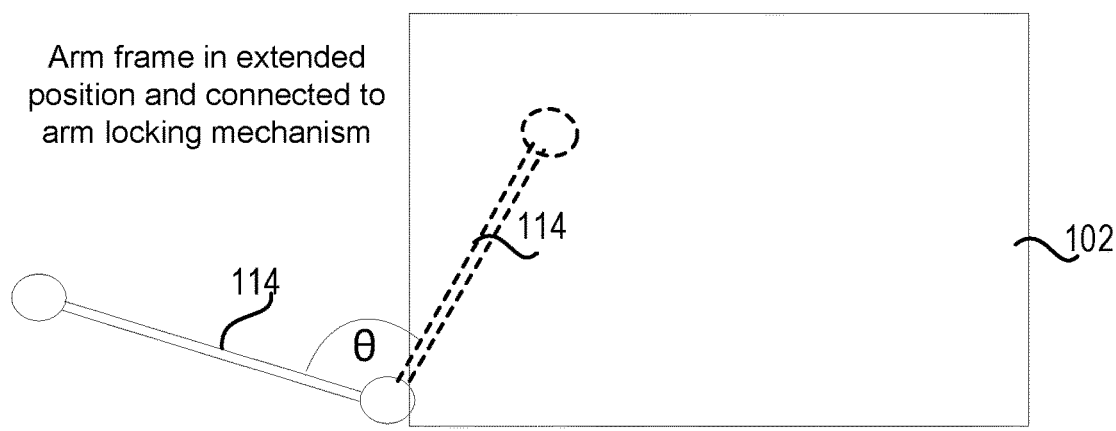
Figure 2C:
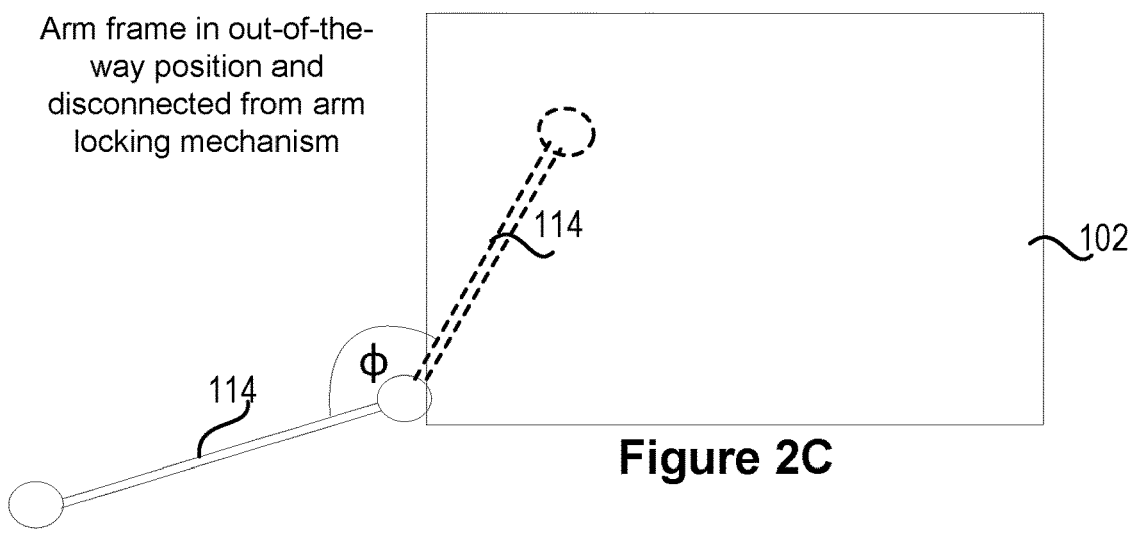

FIGS. 2A-2C illustrate various positions the arm frame 114 of the robot system 100 can be moved, in one implementation. The arm frame 114 is attached to the hinges of the arm support frame 112 disposed on a cart frame 102 so that the arm frame 114 can be moved radially about the arm support frame 112 to an extended position or a folded position. When the robot system 100 is to be moved within the fabrication facility, the arm frame 114 of the robot system 100 is kept in the folded position, as shown in FIG. 2A. The folded position keeps the arm frame 114 within the boundaries of the cart frame 102. In the folded position, the pair of spherical locks 164 (not shown) of the arm locking mechanism 151 fit into folded groove locks defined in the lower mount fixture 150a, thereby causing the arm frame 115 to be locked in the folded position.

FIG. 2B illustrates the arm frame 114 locked in an extended position, in one implementation. The extended position is defined to be at a pre-defined extended angle 'θ°' from the folded position. The top and bottom hinges of the arm support frame 112 allows the arm frame 114 to pivot to the extended position and the arm locking mechanism 151 allows the pair of spherical locks 164 of the upper mount fixture 150b (not shown) to fit into the extended groove locks defined in the lower mount fixture 150a (not shown).

FIG. 2C illustrates the arm frame 114 being unlocked and extended further away from the extended position, in one implementation. When a maintenance operation needs to be performed within a process module, the arm frame 114 may need to be moved out of the way to allow access to certain parts of the process module or for moving certain components of the process module out of the way to provide access to a specific component that needs to be serviced. In order to provide access, the arm frame 114 may have to be moved out of the way (i.e., further away from the extended position). In this implementation, the arm frame 114 is disconnected from the arm support frame 112 so the arm frame 114 can be moved out to provide unhindered access to the parts of the process module. The top and bottom rotating arm pivots 118, 128 (not shown), and the top and bottom hinges 126, 116 assist in moving the arm frame 114 further out from the extended position. The extent to which the arm frame 114 is moved may be equal to 'φ°', as shown in FIG. 2C, wherein φ°>θ°.

Figure 3A:
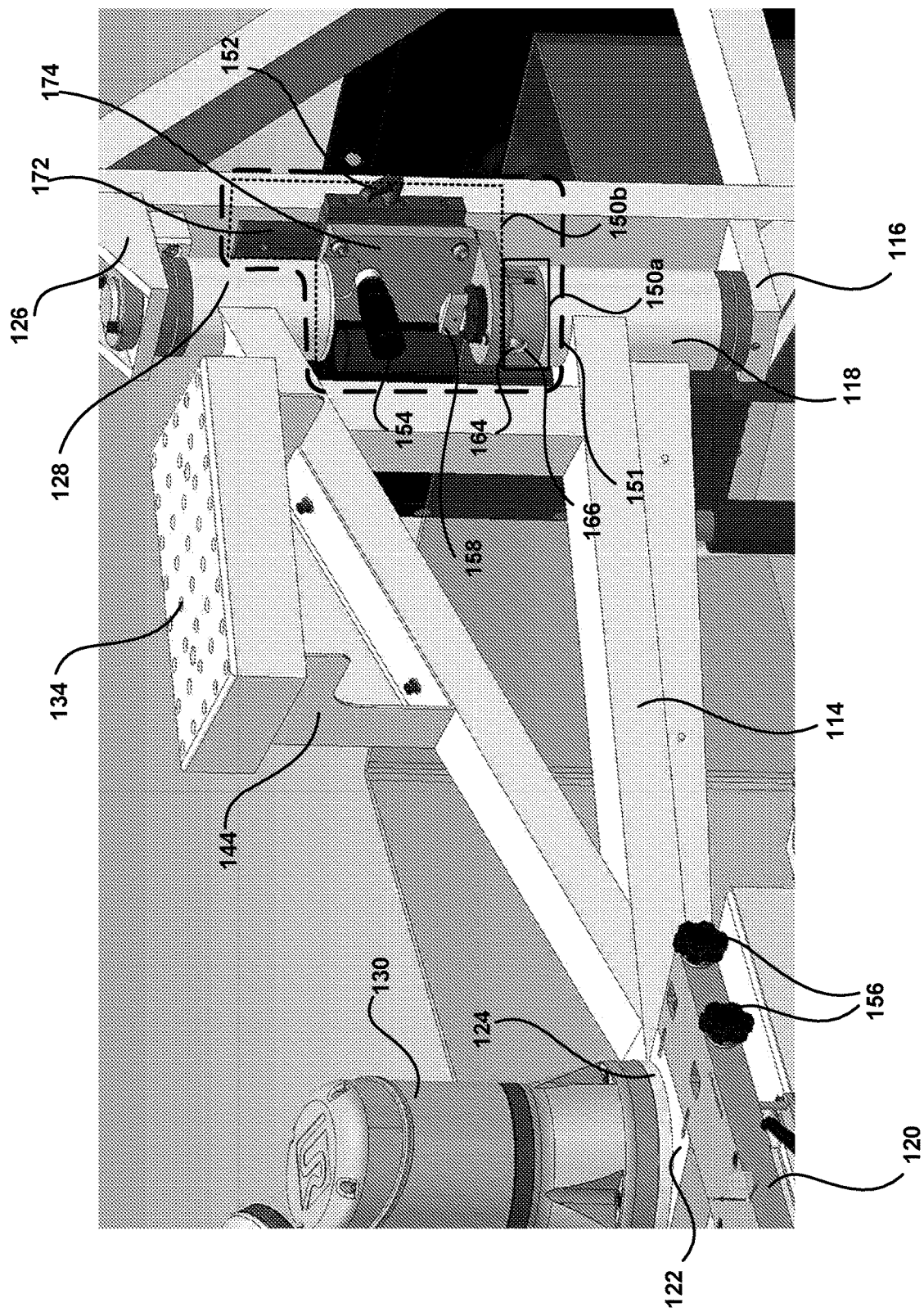
FIG. 3A illustrates a close-up view identifying different components of an arm frame and an arm support frame of the robot system, in accordance with one implementation.

FIG. 3A illustrates an example arm locking mechanism 151 of the arm support frame 112 used to move the arm frame 114 to different positions. The movement of the arm frame 114 to different positions also moves the robot arm 130 that is connected to the arm frame 114. The arm locking mechanism 151 is defined on a first side of the arm support frame 112 and is used to lock the arm frame 114 when the arm frame 114 is moved to an extended position or a folded position. The arm locking mechanism 151 is disposed between a bottom arm rotating pivot 118 and a top arm rotating pivot 128 of the arm frame 114. The arm locking mechanism 151 includes a lower mount fixture 150a and an upper mount fixture 150b. The lower mount fixture 150a is attached to the bottom arm rotating pivot 118. The upper mount fixture 150b is configured to slide between an disengaged position and an engaged position. In the disengaged position, the arm frame 114 is allowed to move freely, while in the engaged position, the arm frame 114 is locked in one of an extended position or the folded position.

The upper mount fixture includes a slider plate 172, a connector plate 174, a locking plate 170 (not shown) and a pair of spherical locks (not shown). The slider plate 172 is attached to a first side of the arm support frame 112. The connector plate 174 is coupled to the slider plate 172. The connection allows the connector plate 174 to slide up or down along a length of the slider plate 172 so as to cause the upper mount fixture 150b to be in the disengaged position (when slid up) or the engaged position (when slid down). A slider lock 152 is disposed on the slider plate 172 and is configured to lock the connector plate 174 at different heights on the slider plate 172.

A handle 154 is disposed on the connector plate 174 to assist in holding and manually moving the connector plate 174 along the slider plate 172 to any desired height, and using the slider lock 152 to lock the connector plate 174 at the desired height. A locking plate 170 is disposed at a bottom end of the connector plate 174. The locking plate 170 is disposed perpendicular to the connector plate 174 and is oriented opposite to the lower mount fixture 150a disposed on the arm frame 114.

A bottom surface of the locking plate 170 includes a pair of spherical locks 164 that are oriented opposite to one another. The pair of spherical locks 164 is disposed so as to align with and fit into corresponding groove locks defined in the lower mount fixture 150a that is disposed below the locking plate 170. In addition to the pair of spherical locks 164, a locking pin handle 158 may be disposed on a top surface of the locking plate 170, in one implementation. The locking pin handle 158 is connected to a locking pin (not shown) extending from a bottom surface of the locking plate 170 and is used to manually operate the locking pin between a locked mode and an open mode.

The lower mount fixture 150a includes a base plate 178 (not shown) that is attached to a top end of a bottom arm rotating pivot 118, which is connected to a bottom hinge 116. The bottom arm rotating pivot 118 is disposed opposite to a top arm rotating pivot 128 that is connected to a top hinge 126. The top and the bottom hinges 116, 126, and the top and bottom arm rotating pivots 118, 128 allow the arm frame 114 to move radially about the arm support frame 112. The base plate 178 of the lower mount fixture 150a includes a plurality of groove locks that extend from a top surface of the base plate 178 into the body of the base plate 178. The plurality of groove locks includes a pair of extended groove locks 168 and a pair of folded groove locks 166. When the arm frame 114 is moved to an extended position, the upper mount fixture 150b of the arm locking mechanism 151 is moved into the engaged position.

In the engaged position, the upper mount fixture 150b is moved down along the slider plate 172 so that the locking plate 170 sits on top of the base plate 178 of the lower mount fixture 150a and the pair of spherical locks 164 defined on the bottom surface of the locking plate 170 fits into the extended groove locks 168, thereby locking the arm frame 114 in the extended position 160. When the arm frame 114 is moved to the folded position, the pair of spherical locks 164 fits into the folded groove locks 168, locking the arm frame 114 in the folded position 161. Once the pair of spherical locks 164 is in the extended position 160 or the folded position 161, the locking pin handle 158 may be used to operate the locking pin to a lock mode. Details of how the arm locking mechanism is used will be explained in detail with reference to FIG. 4A.

The second end of the arm frame 114 includes a fixture connect interface 122. The fixture connect interface 122 includes a top side, a bottom side oriented opposite to the top side, and a plurality of lateral sides extending between the top side and the bottom side. The top side of the fixture connect interface 122 may be used to connect to a first end of the robot arm 130 through a robot connect 124. The robot connect 124 may be a connector plate and may include corresponding fixtures to connect to the top side of the fixture connect interface 122. A first lateral side of the fixture connect interface 122 may include a pair of arm connector points (not shown) that may be used to align the cart frame 102 with and connect to corresponding connection screws 156 defined on a docking fixture 120 disposed on the tool. The connection screws are one form of coupling mechanism that can be used to connect the fixture connect interface 122 to the docking fixture 120 and other forms of coupling mechanism may also be employed.

Figure 3C:
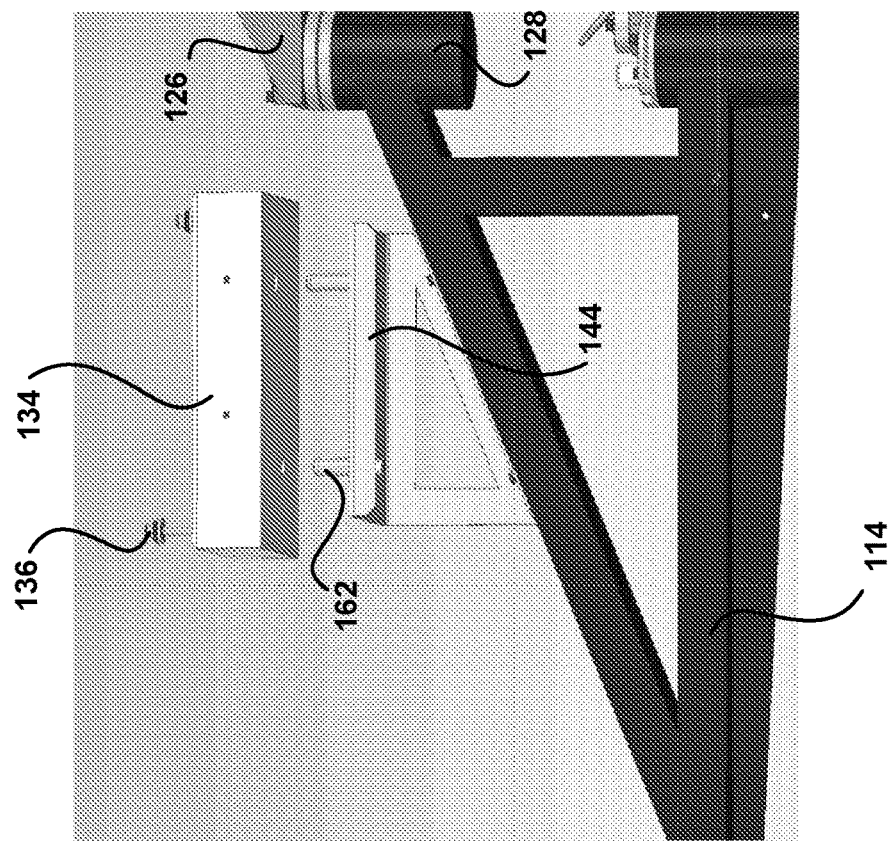
FIGS. 3B and 3C illustrate a close-up view of a portion of the arm frame showing a platform configured to receive a part storage module, in accordance with one implementation.
Figure 3B:
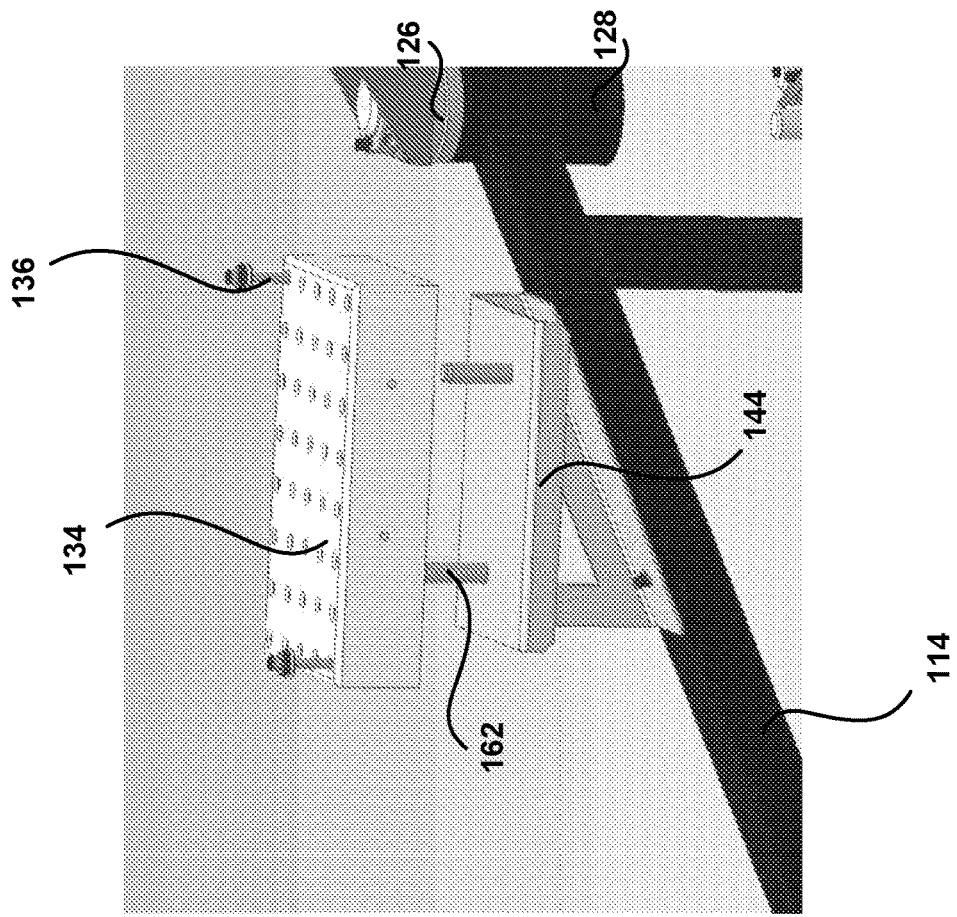

FIG. 3B illustrates a perspective view of a platform 144 provided on a second side of an arm frame 114 on which a part storage module is disposed. In one implementation, the part storage module may be a bolt box 134 that is configured to hold a plurality of bolts 136 used in installing a top plate of the process module. In one implementation, a first end of the second side of the arm frame 114 is coupled to the top arm rotating pivot 128 that is attached to a top hinge 126 and the second end of the second side ends at the fixture connect interface 122. The bolt box 134 may be disposed on the platform 144 using a pair of dowel pins 162, for example. The dowel pins 162 may be made of any material.

FIG. 3C illustrates a side view of the arm frame 114 on which the platform 144 is disposed. A parts storage module, such as a bolt box 134 is disposed on the platform 144. The bolt box 134 may include holes defined on the bottom surface that aligns with the dowel pins 162 disposed on the platform 144 so that the bolt box 134 may be securely supported on the platform 144.

Figure 4A:
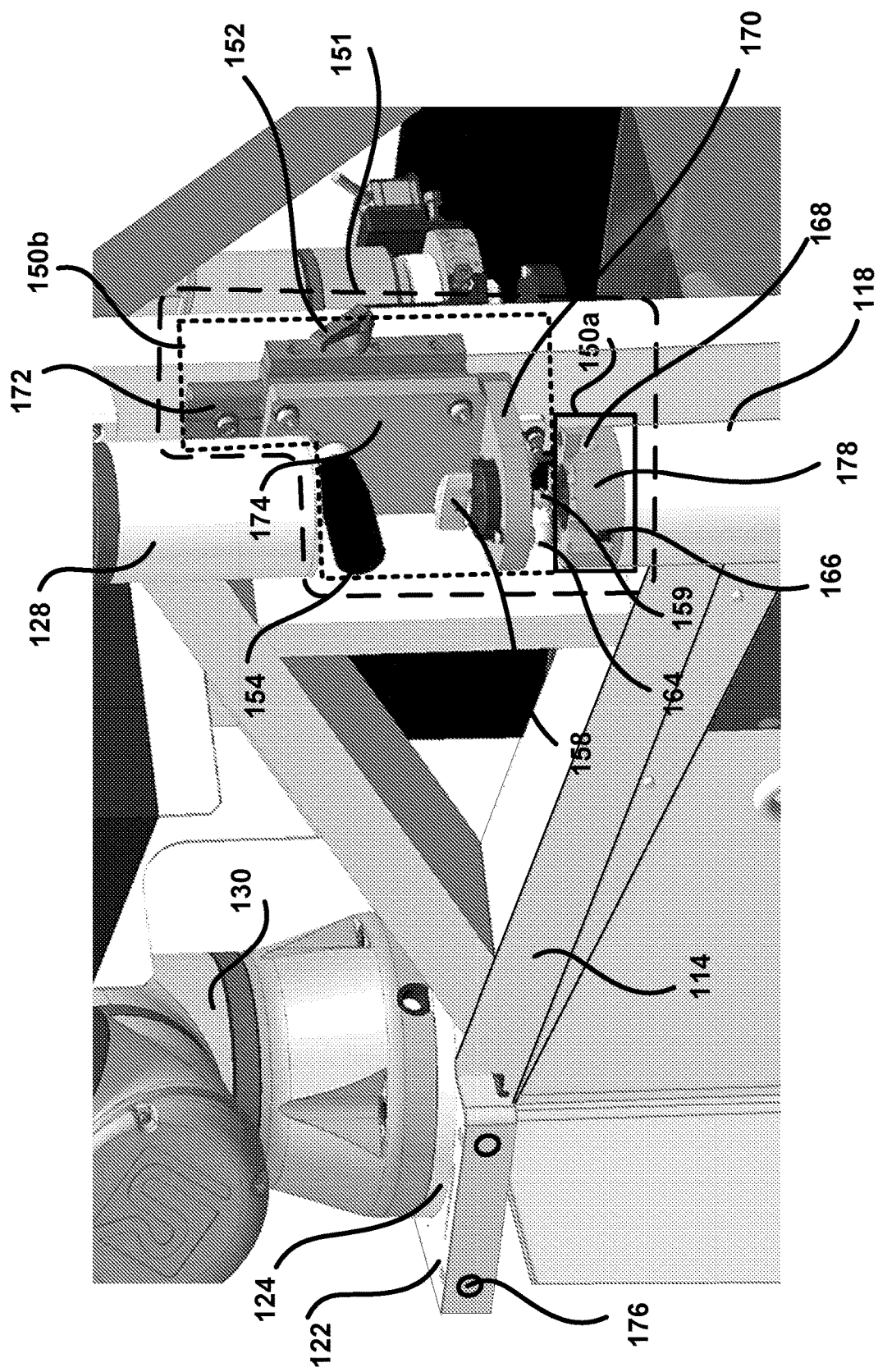
FIG. 4A illustrates a close-up view of an alignment of the arm locking mechanism of the arm support frame with the kinematic mount fixture of the arm frame, in accordance with one implementation.

FIG. 4A illustrates the various components of the arm locking mechanism 151 used in the movement of the arm frame 114 between the folded position and the extended position, in one implementation. FIG. 4B-1 shows, alignment of the groove locks (166, 168) of the lower mount fixture 150a in relation to the spherical locks 164 of the arm locking mechanism 151. Referring simultaneously to both FIGS. 4A and 4B-1, the connector plate 174 of the upper mount fixture 150b of the arm locking mechanism 151 is shown to be in a disengaged (i.e., raised) position on the slider plate 172, revealing the position of the pair of spherical locks 164 on the locking plate 170 and in relation to the groove locks of the lower mount fixture 150a. The connector plate 174 may be raised manually using the handle 154. The pair of spherical locks 164 is disposed on the locking plate 170 so that they align with specific pair of groove locks defined in the base plate 178 of the lower mount fixture 150a.

The plurality of groove locks extends from the top surface of the base plate 178 into the body of the base plate 178. The plurality of groove locks includes a pair of extended groove locks 168 that are oriented opposite to each other and a pair of folded groove locks 166 that are oriented opposite to each other. Further, the pair of folded groove locks 166 is disposed perpendicular to the pair of extended groove locks 168. In some implementation, the folded groove locks 166 extend into the body of the base plate 178 for a depth and have a straight edge at the bottom of the groove locks 166. Alternate design of the folded groove locks may also be envisioned. The extended groove locks 168 are also shown to extend into the body for a depth.

In some implementations, the depth of the folded groove locks 166 may be greater than the depth of the extended groove locks 168, as shown in FIG. 4A. In alternate implementations, the depth of the folded groove locks 166 may be equal to the depth of the extended groove locks 168. The extended groove locks 168 include side-walls that are angled for automatically aligning the spherical locks 164 when the arm frame 114 is in the extended position 160. The slider plate 172 of the arm locking mechanism 151 combined with the side-walls of the extended groove locks 168 act as the third point with the pair of spherical locks 164 acting as the first two points to assist in kinematic alignment of the arm frame 114.

In one implementation, the alignment of the pair of spherical locks 164 to the respective groove locks may be done manually. For example, when the arm frame 114 is in a folded position and has to be extended and locked into the extended position, the handle 154 may be used to manually raise the connector plate 174 so as to cause the upper mount fixture 150b to be in the disengaged position. This is done to move the pair of spherical locks 164 out of the folded groove locks 166. If the slider lock 152 was engaged to lock the connector plate 174, then the slider lock 152 is disengaged before the connector plate 174 is moved up. The slider lock 152 is re-engaged to keep the connector plate 174 in the raised position on the slider plate 172 (i.e., the upper mount fixture 150b in the disengaged position).

FIGS. 4A and 4B-1 show the upper mount fixture 150b in the disengaged position exposing the pair of spherical locks 164 and a locking pin 159 disposed on the bottom surface of the locking plate 170. Raising the connector plate 174 allows free movement of the arm frame 114. Then, the arm frame 114 is moved about the bottom arm rotating pivot 118 attached to the bottom hinge 116, causing the base plate 178 with the groove locks 166, 168, to move radially. The arm frame 114 is moved to the pre-defined extended angle defining the extended position. The pair of spherical locks 164 is disposed on the locking plate 170 so as to align with the corresponding groove locks 166, 168 in one of the two positions (i.e., folded position, extended position) of the arm frame 114. Once the arm frame 114 is at the pre-defined extended angle, as determined by the alignment of the pair of spherical locks 164 to the extended groove lock 168, the slider lock 152 holding the connector plate 174 in the raised position is disengaged and the upper mount fixture 150b with the spherical locks 164 and the locking pin 159 is moved down so that the spherical locks 164 fit into the extended groove locks 168 and the locking pin 159 is received into a pin housing defined in the base plate 178.

The slider lock 152 is once again engaged to lock the connector plate 174 at the lowered position, thereby locking the arm frame 114 in the extended position 160. The locking pin handle 158 disposed on the locking plate 170 may be used to move the locking pin 159 to the lock mode. It should be noted herein that the upper mount fixture 150*b* is moveable vertically along the slider plate 172 and the lower mount fixture 150*a* is moveable along a radial axis. It is also noted that the pair of spherical locks 164 are disposed on the locking plate 170 in accordance to the angle to which the arm frame 114 has to be moved. When the arm frame 114 has to be moved to the folded position, the process of disengaging and re-engaging the upper mount fixture 150*b* is similar to what was described with reference to moving the arm frame 114 to the extended position.

In alternate implementation, the alignment of the pair of spherical locks 164 to the respective groove locks and the raising, lowering of the connector plate 174 may be automated. In such implementations, sensors may be provided in the arm locking mechanism 151, in the arm frame 114 and in the lower and upper mount fixtures 150*a*, 150*b* to automatically move the arm frame 114 to the extended position (i.e., locked position 160) or to the folded position, detect such movement based on the alignment of the pair of spherical locks 164 to the respective groove locks of the lower mount fixture 150*a*, and move the upper mount fixture 150*b* to lock the arm frame 114 in the appropriate position. The slider lock 152 may also be engaged using automatic means. In this alternate implementation, the handle 154 may be optional.

FIG. 4B-2 illustrates a view of the upper mount fixture 150*b* of the arm locking mechanism 151 in which a proximity sensor 180 is disposed on the connector plate 174 to assist in the alignment of the components of the upper mount fixture 150*b* with components of the lower mount fixture 150*a*. Additional sensors may be provided in the arm locking mechanism 151, in the lower mount fixture 150*a* and in the arm frame 114 to allow the arm frame 114 to be moved to different positions and locked in place. It should be noted that the proximity sensor 180 and other types of sensors may also be used in the manual process of moving the arm frame 114 to different positions.

FIGS. 4C-1 and 4C-2 show the overhead view of the base plate 178 of the lower mount fixture 150*a* and FIGS. 4C-3 and 4C-4 show the side view of the different groove locks (166, 168) defined in the base plate 178 in which the spherical locks 164 from the arm locking mechanism 151 are received, in one implementation. FIG. 4C-1 illustrates a pair of folded groove locks 166 disposed on the base plate 178 so that they are oriented opposite to each other. Similarly, a pair of extended groove locks 168 is disposed on the base plate 178 so that they are oriented opposite to each other. Further, the pair of folded groove locks 166 is shown to be oriented perpendicular to the pair of extended groove locks 168. The location of the groove locks 166, 168, is designed to align with the various positions to which the arm frame 114 is to be moved and locked.

FIG. 4C-2 illustrates an instance when the arm frame 114 is moved to the extended position by extending the arm frame 114 to the pre-defined extended angle. The extended position correlates with the position of the extended groove locks 168. As a result, the pair of spherical locks 164 of the arm locking mechanism 151 are shown to align and fit inside the extended groove locks 168 (indicated by solid lines), indicating that the arm frame 114 is locked in the extended position (i.e., locked position) 160. The pair of folded groove locks 166 that correspond to the folded position 161 are shown to be empty (indicated by broken lines), as the spherical locks are shown to currently occupy the extended groove locks 168.

FIG. 4C-3 shows the side view of an extended groove lock 168 of the base plate 178 with the ball portion of the spherical lock 164 received therein, which occurs when the arm frame 114 is moved to the extended (i.e., locked) position 160. As noted before, the extended groove locks 168 may include side-walls that are angled to allow the arm frame 114 to self-align, when moved to the extended position 160.

FIG. 4C-4 illustrates the side view of a folded groove lock 166 of the base plate 178 with the ball portion of the spherical lock 164 received therein, when the arm frame 114 is moved to a folded position 161. The folded groove lock 166 may be used when the robot system needs to be moved toward or away from a process module, so that the arm frame 114 does not get damaged or damage parts of the process module or other components of the fabrication facility in which the process module is disposed.

The locking of the arm frame 114 in the extended position 160 allows the fixture connect interface 122 disposed on the arm frame 114 to align with a docking fixture 120 disposed on a tool, and in the process align the cart frame 102 to the tool. Additionally, moving the arm frame 114 causes the robot arm 130 that is attached to the arm frame 114 to move and align with a process module of the tool. The robot arm 130 is used to perform the various routine maintenance operations at the process module.

Figure 5:
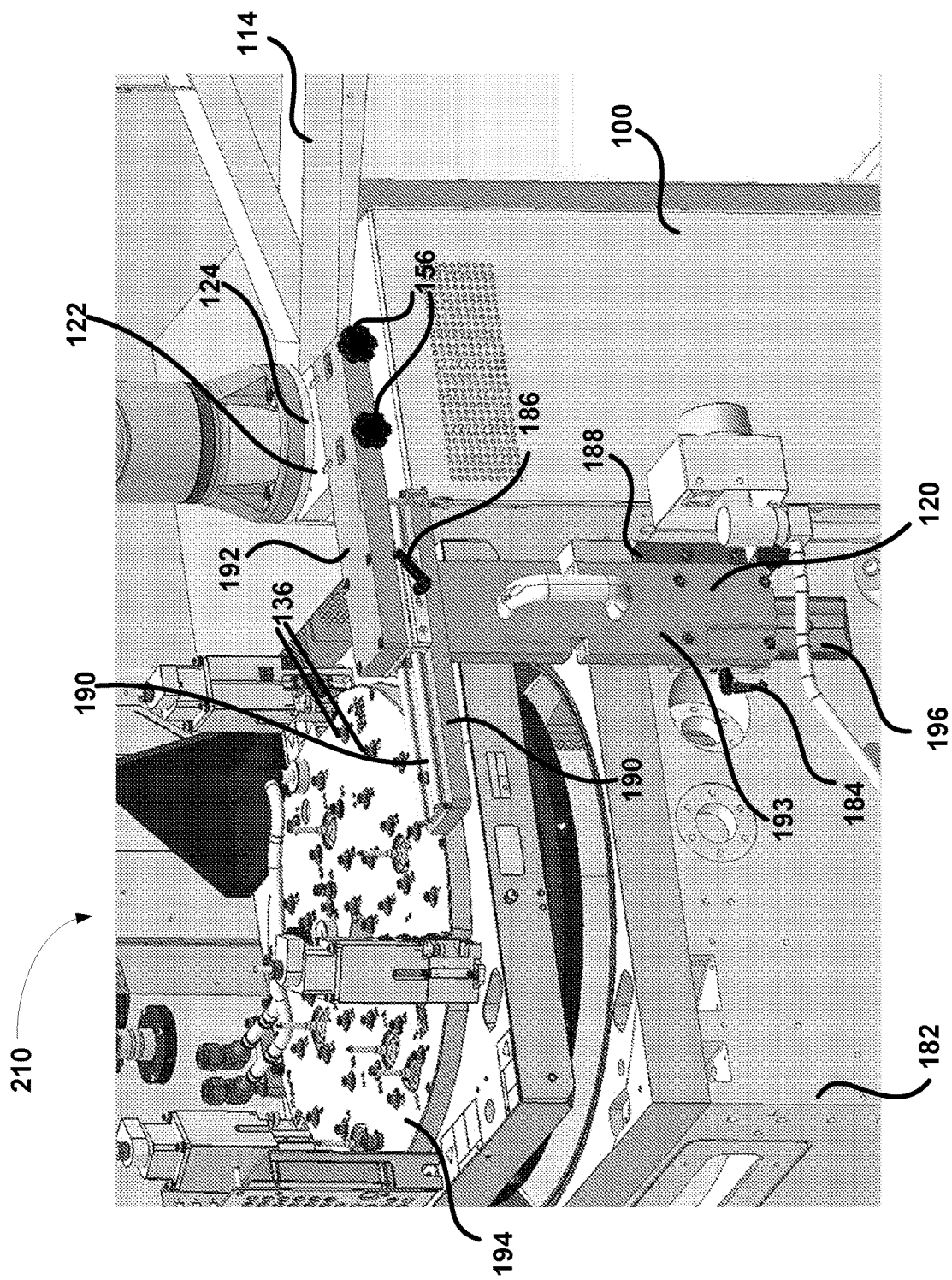
FIG. 5 illustrates a process system within a fabrication facility in which a robot system is engaged to perform maintenance operations, in one implementation.

FIG. 5 illustrates a perspective view of a tool 210 in which the robot system 100 is used to perform a maintenance operation, in one implementation. When the robot system 100 is to be used for performing some maintenance operations at a process module 182 of the tool 210, the robot system 100 is docked to the tool 210. The docking involves moving the robot system 100 in close proximity to a side of the tool 210 that provides convenient access to different components of the process module 182. The docking of the robot system 100 to the side of the tool 210 may be performed manually or automatically by moving the robot system 100 in close proximity (e.g., about 2"-about 5") to the tool 210, and then using the sensors, such as proximity sensors, lasers, etc., disposed in the robot system 100 and the tool 210 to further finely align with the side of the tool 210. The sensors may indicate the orientation of the robot system 100, which can be used by the robot system 100 to align with the tool 210. It should be noted that the robot system 100 is aligned with the tool along the tool side.

Once the robot system 100 is aligned to a side of the tool 210, the arm frame 114 of the robot system 100 is moved to the extended position 160 and locked into place using the arm locking mechanism 151 attached to the arm support frame 151. The extended position 160 allows the fixture connect interface 122 to be brought close to the docking fixture of the tool 210. The docking fixture 120 may be attached to the chamber of the tool 210, a frame of the chamber, or any other part of the tool 210 or may be directly mounted to a sidewall of the process module 182. The coupling of the fixture connect interface 122 to the docking fixture 120 is explained with reference to the implementation where the docking fixture 120 is directly attached to the outside sidewall of the process module 182 of the tool 210, and this can be extended to other implementations where the docking fixture 120 is attached to some part of the tool 210.

The process module 182 includes a docking insert 188 that is permanently mounted to an outside sidewall and is configured to receive a docking fixture 120. In one implementation, the docking fixture 120 is a moveable component that may be provided by the robot system 100. In this implementation, the docking fixture 120 may be disposed on a storage handle defined on a sidewall of the cart frame 102. When the robot system 100 needs to be docked to the process module 182, the docking fixture 120 may be manually removed from the storage handle of the cart frame 102 and affixed to the docking insert 188. The docking insert 188 and/or the docking fixture 120 may include one or more fixture locks to lock the docking fixture 120 in place on the process module 182 or the tool 210. In alternate implementation, the docking fixture 120 may be installed on the docking insert 188 automatically.

In the implementation illustrated in FIG. 5, a fixture rail 196 is permanently affixed to an external sidewall of the tool 210. In an alternate implementation, the docking insert 188 is configured to receive the fixture rail 196 (illustrated in FIGS. 6A and 6B) of the docking fixture 120, wherein the docking insert 188 is fixably mounted on an external sidewall of the tool 210. The fixture rail 196 is configured to slide along the length of the docking insert 188 to allow the docking fixture 120 to be moved vertically to different heights. A fixture lock, such as fixture lock 1 184, is provided on the fixture rail 196 to lock the docking fixture 120 at different heights. The docking fixture 120 includes a horizontal docking slider plate 192 and a vertical plate 193. The vertical plate 193 is received on the fixture rail 196 so that the vertical plate 193 can be moved vertically to different heights and the fixture lock 1 184 engaged to lock the vertical plate 193 at a desired height. A handle disposed on the vertical plate 193 assists in grabbing and moving the docking fixture 120 (e.g., when moving the docking fixture 120 from the cart frame 102 and when moving the vertical plate 193 to different heights). The horizontal docking slider plate 192 moves horizontally along a horizontal slider 190, and a fixture lock 2 186 may be used to lock the docking slider plate 192 in place. One or more connection screws 156 may be disposed on the horizontal docking slider plate 192 to connect the docking fixture 120 to the fixture connect interface 122 of the robot system 100. The connection screws 156 may be any type of screws that are capable of providing a tight (i.e., compressed) and reliable fit. The horizontal docking slider plate 192 can be extended along the horizontal slider 190 to align with the fixture connect interface 122 of the arm frame 114.

When the robot system 100 is to be set up for performing some maintenance tasks, such as installation, cleaning, inspection, validation, etc., or for running metrology applications, on the process module 182, the tool side of the robot system 100 is moved to align with a side of the process module 182 that provides access to the different parts of the process module 182. The arm frame 114 of the robot system 100 is moved to the extended position 160 and locked in place using the arm locking mechanism 151 of the arm support frame 112. The vertical plate 193 of the docking fixture 120 is moved along the fixture rail 196 to a raised position and the fixture lock 1 184 is used to lock the vertical pate 193 in the raised position. The raised position to which the vertical plate 193 is moved may be based on the height at which the arm frame 114 is disposed, when in the extended position 160. The docking slider plate 192 of the docking fixture 120 is moved horizontally along the horizontal slider 190 to an extended position so as to align the connection screws 156 defined on the docking slider plate 192 to the fixture connect interface 122 of the extended arm frame 114.

The docking slider plate 192 is then locked in the extended position using the fixture lock 2 186 defined on the docking slider plate 192. The connection screws 156 are tightened, thereby docking the arm frame 114 of the robot system 100 to the docking slider plate 192 of the docking fixture 120. The docking position aligns the body of the cart frame 102 to the process module 182/tool 210 and lends stability to the robot arm, allowing very minimal amount of vibration to the robot system 100. Additional stability may be provided by locking the casters 140 using the caster locks 142. In some implementation, additional leg extensions (not shown) may be provided at the cart frame 102 to provide further stability to the robot system 100. The additional leg extensions may be moved out to an engaged position when additional stability of the robot system 100 is needed.

The arm locking mechanism 151 together with the docking fixture 120, and the design of the robot system 100 provides a reliable arm frame-to-cart and robot system-to-process module docking that satisfies various form factor requirements, including vibration stability, low center of gravity, mobility, maneuverability, and size. The interlocking fixtures both within the robot system 100 and the docking fixture may be designed to ensure that the robot system 100 is operable only when the interlocks are engaged, thereby preventing unsafe operation of the robot system 100. Safety interlocks will prevent operation of the robot system 100 when the robot system 100 is not docked properly to the process module 182 or the tool 210. The robot system connected to the process module 182 or to the tool 210 enables performing smooth and versatile maintenance operation at the process module 182.

Figure 6:
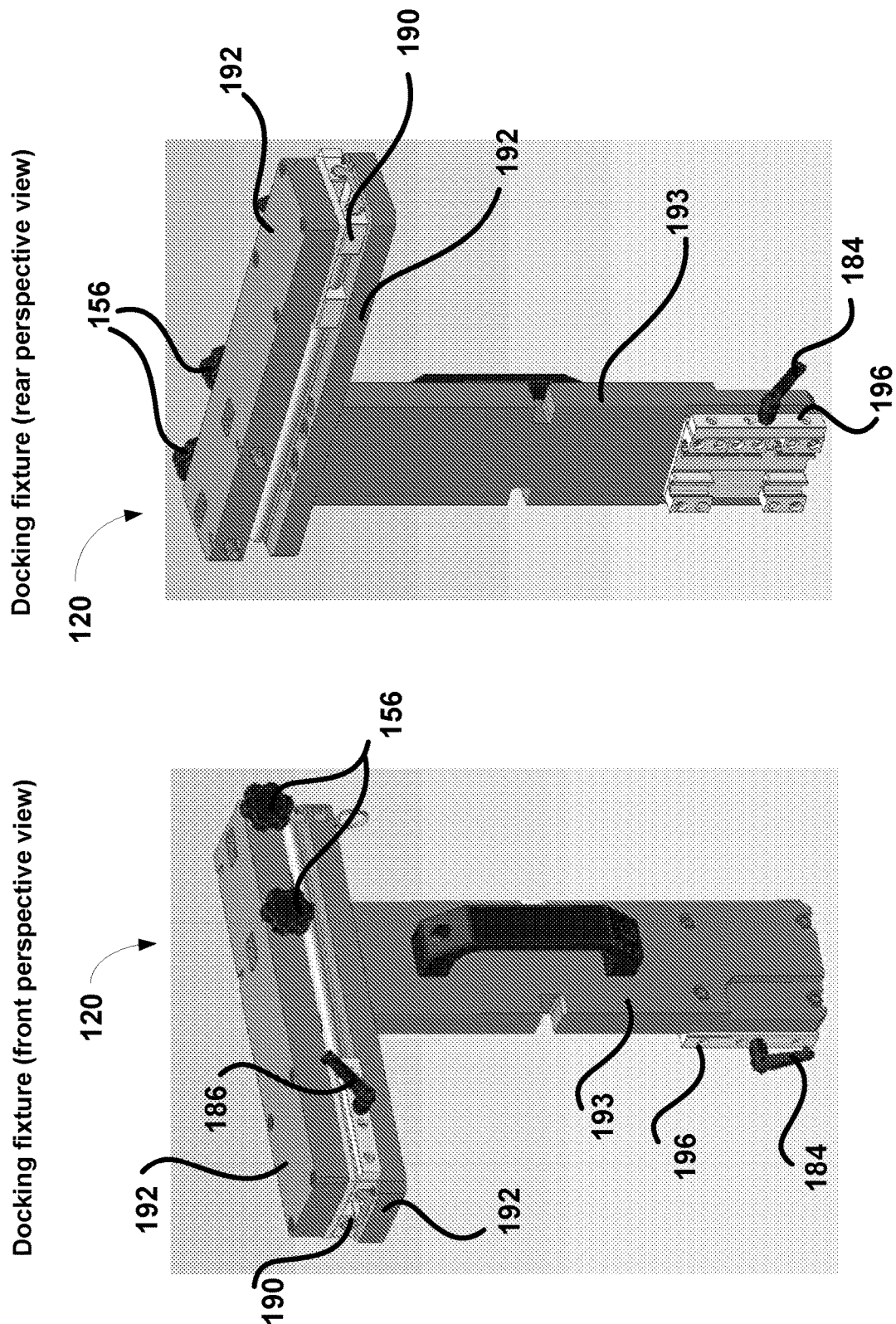
FIGS. 6A and 6B illustrate front and rear perspective views of a docking fixture used to dock the robot system to a process module that is part of the process system of the fabrication facility, in one implementation.

FIGS. 6A and 6B illustrate different views of a docking fixture 120 used in docking the robot system 100 to a process module 182 of interest in a semiconductor tool (e.g., cluster tool) or in a fabrication facility that includes a plurality of process modules. The semiconductor tool can be configured to perform a wafer processing operation, such as an etch operation, or a deposition operation, or a cleaning operation, etc., and is not restricted to any specific type of semiconductor tool. FIG. 6A shows the front perspective view of the docking fixture 120 and FIG. 6B shows the rear perspective view of the docking fixture 120. Referring simultaneously to FIGS. 6A and 6B, the docking fixture 120 includes a fixture rail 196 disposed on a back side and a handle on a front side of a vertical plate 193 of the docking fixture 120. The handle is used to hold the docking fixture 120 and to move the docking fixture 120 vertically along a docking insert 188 that is disposed along a vertical axis on the outside sidewall of the process module 182 within the tool 210. The fixture rail 196 includes a fixture lock 1 184 for locking the docking fixture 120 at a desired height along the docking insert 188. A docking slider plate 192 of the docking fixture 120 is disposed perpendicular to the vertical plate 193. The docking slider plate 192 includes a horizontal slider 190 that is configured to extend the docking slider plate 192. A fixture lock 2 186 is provided on the docking slider plate 192 on a side that can be accessed when the docking fixture is coupled to the docking insert 188 on the process module 182.

Connection screws 156 are also provided on the docking slider plate 192 to connect the docking fixture 120 to a fixture connect interface 122 disposed on the arm frame 114 of the robot system 100 when the robot system 100 is docked at the process module 182 or at the tool 210 that includes the process module 182. The connection screws 156 may be provided on the same side as the fixture lock 2 186 or on a different side that is easily accessible. The connection screws 156 align with the corresponding arm connecting points 176 defined on the fixture connect interface 122 so that the connection screws 156 can be used to tightly couple the docking fixture 120 to the robot system 100 at the fixture connect interface 122.

Figure 7:
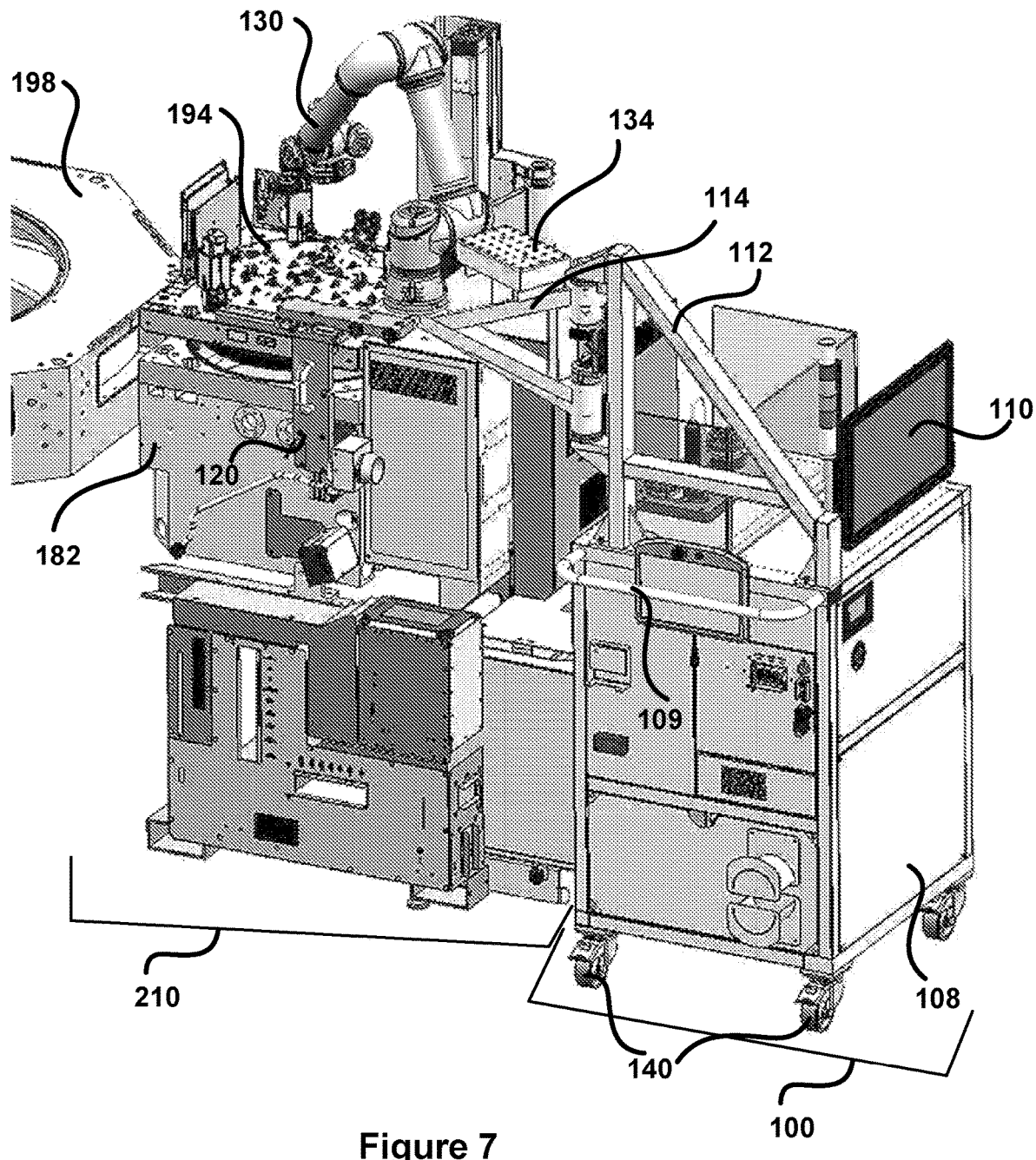
FIG. 7 illustrates a view of a robot system coupled to a docking fixture of a process module, when in an engaged mode, in accordance with one implementation.

FIG. 7 illustrates a robot system 100 connected to a tool 210. The tool 210 may be part of a fabrication facility or a stand along cluster tool. The cluster tool includes a transfer module 198 around which a plurality of process modules 182 are disposed, wherein each of the process module 182 is configured to perform a certain operation on a substrate received in the cluster tool. The tool 210 has a docking fixture 120 attached to the docking insert 188 disposed on an outside sidewall. The docking insert 188 may be attached directly to the outside sidewall of the process module 182 or may be attached to a frame of a chamber of the tool 210. In the current implementation illustrated in FIG. 7, the docking insert 188 is shown to be attached to the outside sidewall of the process module 182 and is in an engaged mode. In the engaged mode, the vertical plate 193 has been moved up along the length of the docking insert 188 so as to be in a raised position, and the docking slider plate 192 is extended along the horizontal slider 190 to an extended position. The extended position aligns the docking slider plate 192 to the fixture connect interface 122 of the arm frame 114 of the robot system 100. The arm frame 114 is in the extended and locked position 160. The connection screws 156 disposed on the docking fixture 120 are used in the docking of the robot system 100. This results in the alignment of the robot system 100 to the tool 210 (i.e., robot-to-tool alignment), wherein the robot arm 130 attached at the first end to the arm frame 114 is positioned in relation to the extended position of the arm frame 114.

Next, a vision system disposed in a second end of the robot arm 130 is used to perform robot arm-to-component alignment. The arm-to-component alignment is adjusted in accordance to a specific component of the process module 182 that is being serviced. Lasers mounted on the robot arm 130 may be used to check the orientation of the chamber of the tool 210 and/or components of a process module that is to be serviced, by checking the yaw, pitch, and roll parameters of the chamber/component against that of the robot and adjust the alignment of the robot arm 130 accordingly.

Once the robot arm-to-component alignment is completed, the robot arm 130 attached to the arm support frame 112 is now able to access the specific component of the process module 182. The robot-to-tool alignment and the arm-to-component alignment provide stability to the cart frame 102. The power cables, system clean-dry-air line, etc., are connected to the chamber platform or the chamber itself. The current design of the robot is versatile enough that it can be easily adaptable to dock at different chamber types and perform different operations.

In one implementation, the robot arm may be used to install a top plate 194 on a process module 182 used for etching (i.e., etch chamber). In another implementation, the robot arm 130 may be used to move the top plate 194 from the process module 182 so as to provide access to the inside of the process module 182 for performing operations, such as cleaning the interior walls, installing consumable parts, inspecting state of the consumable parts and other components of the process module 182, run metrology applications, apply gel, etc.

Figure 8:
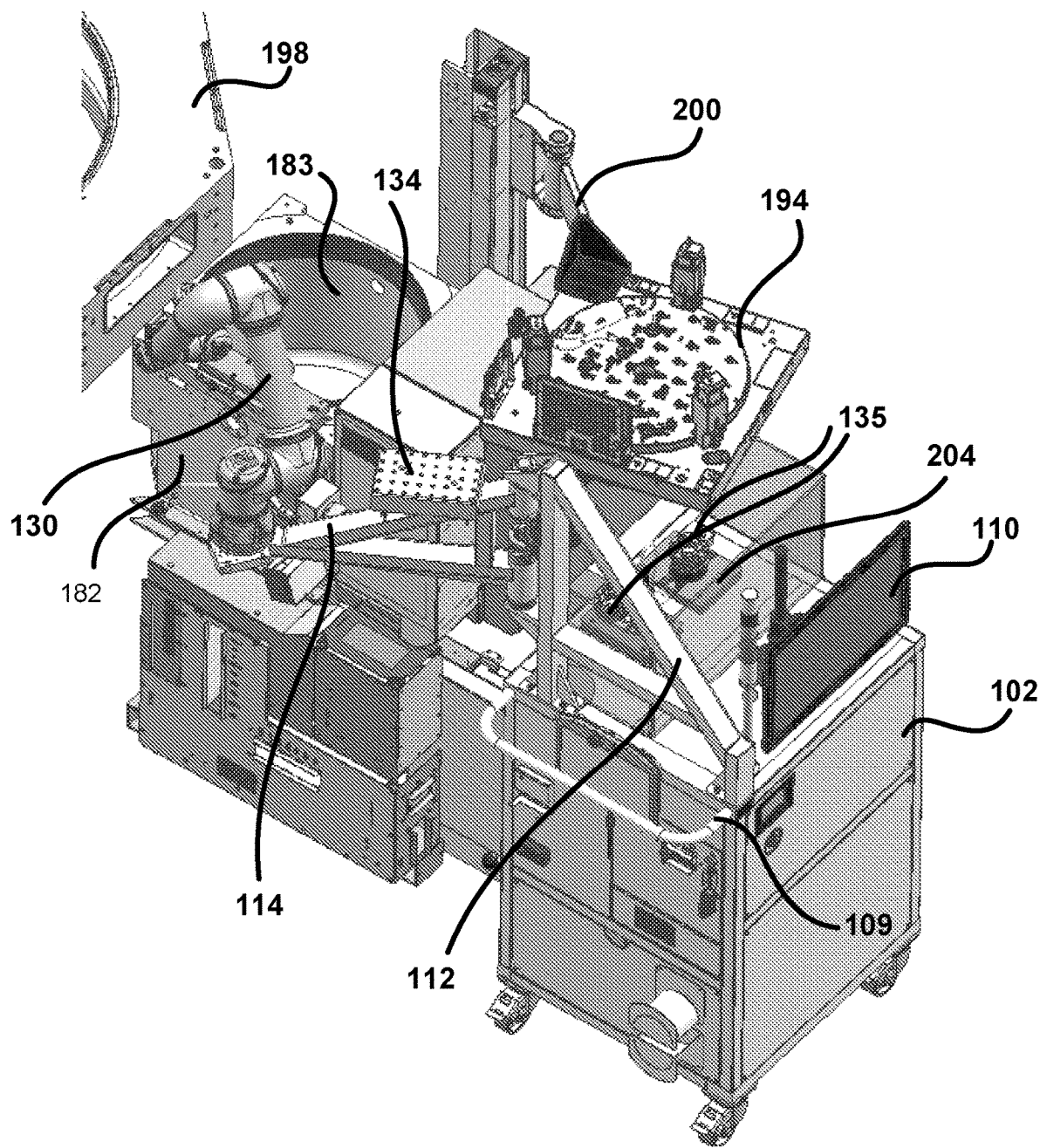
FIG. 8 illustrates a view of a robot system in relation to a process module, when the robot system is disconnected from the docking fixture, in accordance with one implementation.

FIG. 8 illustrates a view of a process system (i.e., a cluster tool) where the docking fixture 120 connecting the robot system 100 to the process module 182 is in a disengaged mode, in one implementation. The docking fixture 120 may have to be disengaged in order to provide unhindered path for moving certain ones of the components of a process module. For example, a top plate 194 of a plasma etch chamber (i.e., process module that is used to perform etching) may have to be moved out to allow the robot arm 130 to access the inside of the plasma etch chamber for cleaning or parts inspection. The docking fixture 120, in the engaged mode, may prevent the movement of the top plate 194 as the vertical plate 193 may have extended the docking fixture 120 above the top surface of the plasma etch chamber and/or the docking slider plate 192 may have been extended blocking the path in which the top plate 194 has to be moved.

The disengaged mode is accomplished by first disconnecting the docking fixture 120 on the process module 182 from the fixture connect interface 122 of the robot system 100, unlocking the fixture locks 1 and 2 184, 186, sliding the docking slider plate 192 back, and lowering the vertical plate 193 of the docking fixture 120. Then the arm frame 114 is moved out of the way by unlocking the arm frame 114 from the arm support frame 112 (i.e., the upper mount fixture 150*b* is moved to disengaged position) releasing the arm frame 114. The arm frame 114 is then swung out further, as shown in FIG. 8, to an "out-of-the-way" position by moving the arm frame 114 by $\varphi°$. The out-of-the-way position is different from the locked position 160 (i.e., arm frame 114 moved by $\theta°$ and the folded position 161. A plate moving arm (or swing arm) 200 associated with the process module 182 is then used to lift and move the top plate 194 away from the opening of the process module 182.

Figure 9A:
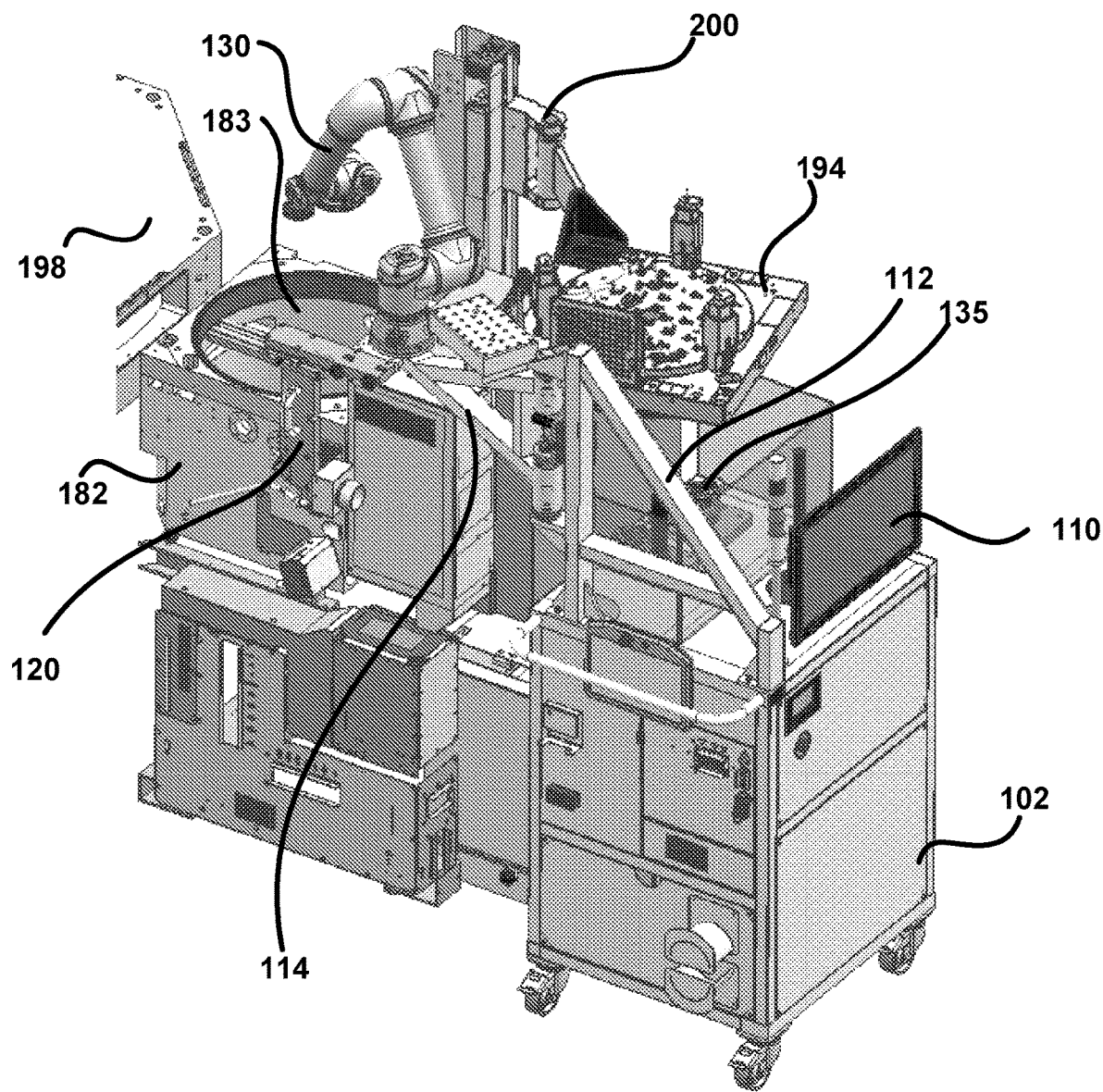
FIG. 9A illustrates a view of the robot system in relation to a process module, when the robot system is re-engaged with the docking fixture disposed on the process module, in accordance with one implementation.
Figure 9B:
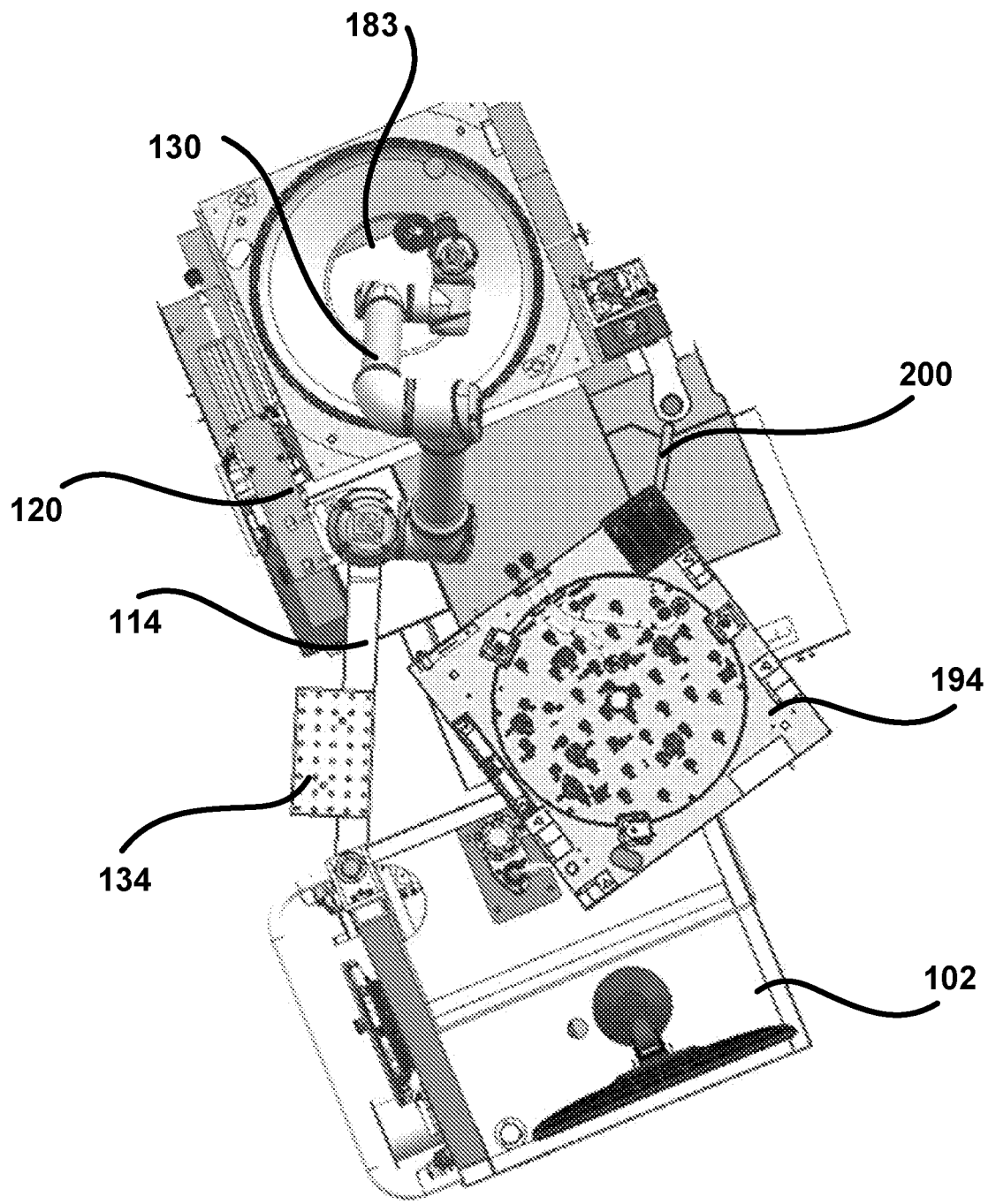
FIG. 9B illustrates an overhead view of the robot system in the re-engaged mode shown in FIG. 9A, in accordance with one implementation.

FIG. 9A illustrates a view of the docking fixture 120 being re-engaged and the arm frame 114 being re-connected to the docking fixture 120 so as to allow the robot arm 130 to access the interior 183 of the process module 182 to perform a desired operation, such as cleaning or inspecting the interior of the process module 182, in one implementation. FIG. 9B illustrates a overhead view of the implementation shown in FIG. 9A. In this implementation, once the top plate 194 is removed from the top of the process module 182 by moving the arm frame 114 and the docking fixture 120 out of the way, the arm frame 114 may have to be re-engaged so as to allow the robot arm 130 attached to the arm frame 114 to access the different regions inside the process module 182.

Accordingly, the arm frame 114 is moved back to the extended position 160 and the docking fixture 120 is moved into position to align the connector screws 156 of the docking fixture 120 with the corresponding arm connector points 176 defined on the fixture connect interface 122. The connector screws 156 are then tightened thereby docking the robot system 100 to the process module 182. The robot arm 130 is then moved toward the opening of the process module 182 so that the robot arm 130 can access the interior 183 of the process module 182. Lasers and sensors disposed on the second end of the robot arm 130 may be used to guide the robot arm 130 and to align the robot arm 130 to the appropriate parts of the process module 182 to perform the different maintenance operations.

In addition to the sensors, interlocks are provided in the robot system 100 and the docking fixture 120 to ensure human safety. For example, sensors and interlocks may be provided in the upper mount fixture 150*b*, the lower mount fixture 150*a* and in other parts of the arm locking mechanism 151 to ensure that the locks connecting the various components of the robot system 100 are in place before allowing the various components to be engaged and/or moved.

The robot system 100 is engaged to perform repetitive tasks involved during equipment and parts installation and routine maintenance processes with a high level of precision. The actions and sequences involved in some of the tasks performed in certain process modules are coded into the robot so that these repetitive tasks can be performed with increased precision and speed. The various sensors associated with the vision system and the other sensors of the robot system 100, including one or more cameras, motion sensors, gyroscopes for inertial sensor processing, pressure sensors, temperature sensors, speed sensors, torque sensors, power sensors, leveling sensors, and combinations of two or more sensors, etc., may be used to align the position of the robot system 100, the robot arm to specific components of the process module or the tool to allow the robot system 100 to perform specific operations efficiently, and to validate the accuracy of the tasks or operations performed. For example, the vision system may be used to check if the cleaning was done in accordance to standards set for the robot, or if the installation of consumable parts was carried out correctly by inspecting the newly installed consumable parts for kinks, twists, gaps, etc.

The vision system may also be used to run on-the-spot metrology applications (i.e., inspections, audits), such as checking the state of the electrostatic chucks (ESCs), edge rings, liners, and chamber inner sidewalls for defects and cleanliness, scrubbing the inside sidewalls to remove polymer residues and checking the effectiveness of the scrubbing in the process module, applying gels when installing edge rings, etc.

The robot system is also used to record all performed maintenance tasks/operations, including various metrics (e.g., position, force, torque values, images, etc.,) used in performing such tasks, as a function of time. This data is then fed to the computer that is locally available in the mobile cart 101, and/or within the fabrication facility, or remotely on a cloud system, wherein the communication connection may be wireless. Information provided by the metrics can give a local geo location of the robot within the fabrication facility, operations performed by the robot, process modules serviced, components within the process modules serviced, and other operations performed by the robot. The cloud system collects all the data from the metrics information fed by the plurality of robot systems distributed within the fabrication facility and uses it to perform machine learning. The machine learning uses an artificial intelligence (AI) algorithm to extract features from the various different data sets obtained from individual data flows, including image data, torque data, position data, location data, historical data, etc. Classifiers are defined by identifying features and each classifier is used to generate AI models. These AI models are trained with more and more raw data flowing from the different data sets. The AI algorithm may be used to customize the AI models for each chamber (i.e., process module) of each tool, and also to have a universal AI model.

The customized AI models as well as the universal AI model may be used as standards and for identifying differences between a particular process module and the customized and/or the universal AI model so that recommendations can be provided based on the differences that are learnt from different chambers (i.e., process modules). The AI models for specific process modules can be queried to identify various aspects of the particular process module (e.g., aspects of the top plate used in the process module, actions and sequences of operations to be performed, component details, etc.) to provide recommendations related to the maintenance schedule, and other maintenance operations.

For instance, once the robot system 100 performs some operations in a particular tool, the metrics collected by the robot system 100 are used to identify various aspects of the particular tool. These are fed to the AI algorithm to train the respective AI models (tool specific AI model and the universal AI model). After performing various operations at different tools (i.e., chambers or process modules) in the fabrication facility, when the robot system is docked at a particular tool, the robot system can recollect all the attributes of the particular tool by querying the AI model for the particular tool. The information provided by the AI models can be used to determine which chamber the robot worked on, number of times the chamber was worked on, identifying issues within one or more operations, predicting recommendations for the different operations, or providing recommendations to resolve issues identified from specific operations. The operations can include cleaning, maintenance, installation, metrology, etc. The information provided by the AI model may be used for diagnostics, installation and maintenance standardization, and customized predictive maintenance, etc. In addition to identifying various aspects of the different tools, the raw data collected by the robot system can be analyzed to determine various aspects of the fabrication facility, which can be used to efficiently manage the fabrication facility. More details related to machine learning is described with reference to FIG. 16.

It should be noted that the machine learning is optional. In alternate embodiments, operations performed by the robot are controlled by a computer program. The computer program provides the process by which the robot will perform each movement to complete the desired servicing operation. The program guides the robot by providing detailed instructions for performing each movement (e.g., details related to location, speed, direction the robot arm has to be moved) of the desired servicing operation.

With the general understanding of the benefits of the integration of the robot system in the fabrication facility or cluster tool for performing routine and repetitive maintenance operations, specific applications of using the robot system will now be described in detail.

Installation of a Top Plate:

One of the applications in which the the various embodiments of the robot system 100 can be used is in the installation of a top plate 194 in an etch chamber (i.e., process module 182) of a process system, for example. The installation of the top plate 194 involves specific actions and specific sequences that need to be followed. For example, the top plate 194 may include a total of 40 bolt holes to receive 40 mounting bolts (or simply referred to herein as bolts). The bolts, for example, may be configured to hold together certain assemblies (e.g., heater assembly, etc.,) and connect these assemblies to the top plate 194.

The 40 bolts have to be torqued incrementally in a very specific pattern (e.g., a star or similar pattern) to achieve specific torque value (e.g., up to 60 inch-pounds). In one implementation, the bolts may have to be torqued by following a star pattern. In another implementation, the bolts may have to be torqued following a different pattern. Further, the bolts have to be torqued incrementally to reach the specific torque value. For example, initially, the bolts may have to be torqued to 7 inch-pounds, then torqued three additional times by incrementing the torque to 20 inch-pounds, 40 inch-pounds, and 60 inch-pounds, with each round of torquing following the specific pattern. In one example, the installation altogether may require a total of 6 cycles involving 240 torque operations for installing one single top plate 194 in a single etch chamber. The sheer number of torque operations for installing a top plate in one chamber is daunting. When this process has to be done periodically on a plurality of etch chambers in the fabrication facility, it can become overwhelming Further, if the torque is not done correctly (e.g., the specific pattern not followed correctly, or the appropriate incremental torque value not applied), it can cause the top plate temperature drift due to inadequate heat dissipation (i.e., resulting from incorrect installation) and result in yield loss and unscheduled down events. Considering that such details have to be followed during installation in hundreds of process chambers in a fabrication facility, if this operation has to be performed by an operator, the risk of human-introduced errors are very high. To avoid these issues, the robot arm 130 can be programmed to perform the repetitive task involved in the installation with great precision and reliability. The speed with which these operations are performed using the robot is considerably faster than that performed by a human operator. Additionally, the consistency, precision, sequence, and amount of torque applied by the robot are steady and repeatable.

The vision system of the robot arm 130 is used to scan the top plate and identify the different locations where the bolt holes 137 are defined in the top plate 194 of the etch chamber. Then, the robot arm 130 is taught to scan the surrounding area including the cart frame to identify the location of the bolt box 134 received on a platform 144 defined in the arm frame 114, and the location of each bolt 136 in the bolt box 134. Additionally, the robot is programmed to identify the bolt holes 137 in accordance to a specific pattern that needs to be followed, install the bolts 136, and follow the specific pattern to torque the bolts 136. The robot arm 130 is then used to perform the task of installing the bolts 136 in the top plate 194 and the installation follows the specific pattern and the specific sequence of torquing.

It should be noted that the specific pattern may be specific to a particular etch chamber, and the pattern may depend on the size of the top plate, number of bolt holes 137 defined, size of the etch chamber, etc. In some etch chambers, the number of bolt holes available on the top plate 194 may be fewer than 40, while in other etch chambers the number of bolt holes may be greater than 40. Further, the sequence followed in the pattern for installing the bolts in the top plate 194 may depend on the size of the top plate and the number of bolt holes defined on the top plate 194.

Once the cart frame 102 is docked to the tool 210 and the robot arm 130 is aligned with the chamber of the tool 210, the bolt install and torque operation sequence is initiated. In response to the initiation, the cameras attached to the second end of the robot arm 130 automatically take images of the surface of the top plate 194 and uses computer vision to orient the robot arm 130 with respect to two empty bolt holes 137. Then the laser leveling system that is attached to the second end of the robot arm 130 hovers over the chamber top plate and takes height readings at three distinct locations to establish the height and special orientation of the work plane with respect to the horizontal plane defined by the robot arm 130. This is followed by the bolt installation and torqueing. Images after each torqueing and after each round of torqueing are captured as data for the installation operation. All of the resulting data from the installation operation performed by the robot arm, in response to the initiation of the bolt install operation, is recorded as a function of time.

The data that may be recorded include height measurements, images, install and torque positions and values, tilts, etc. When torqueing, the robot arm 130 follows a specific pattern, the torqueing values specified for the top plate 194 for the chamber, and specified increments of torque values and specified repetitions. The automation of this process eliminates human error and reduces unscheduled equipment maintenance. This process also enables better chamber-to-chamber matching across the fabrication facility. The data recorded provides a detailed log of what happened and can be later referenced for problem diagnostics and predictive maintenance.

As part of the bolt installation, the robot arm 130 is first used to supply the bolts 136 to the different bolt holes 137 defined in the top plate. The end-effector connector in the second end of the robot arm 130 couples with a bolt grabber end-effector 135 to move the bolts 136 from the bolt box 134 to the respective bolt holes 137. Once all the bolts have been moved to the corresponding bolt holes, the robot arm 130 performs the torqueing operation by torqueing the bolts in the top plate 194 in accordance to the pattern and the torque value specified. When the first bolt 136 is installed and tightened in accordance to the torque value applied, the top plate 194 may tilt on the opposite side and this tilt may be due to pressure occurring at the site of first bolt 136. This tilt in the top plate 194, even though it is subtle (e.g., may be 5° or 10°), needs to be taken into consideration when the robot arm 130 is being positioned to tighten a second bolt 136 so that the second bolt 136 is installed correctly. Similarly, when the third bolt is tightened, the tilt characteristics of the top plate 194 due to the tightening of the first and the second bolts have to be taken into consideration.

The algorithm that runs the robot arm 130 is programmed to take into consideration the amount of tilt of the top plate due to the compression from the tightening of the first bolt 136 and to calibrate a complementary tolerance that needs to be provided when tightening the second bolt. This calibration is built into the algorithm running the robot arm 130 by empirically determining the sequence number of bolt that is being tightened, relative position and sequence of the bolt that was previously tightened, position and sequence of the bolt that is to be tightened next, status of the other bolts, and adjust the tolerance by a predetermined amount when tightening the next bolt in place. The algorithm automatically performs a correction to the position of the end-effector that is used in the installation depending on where the end-effector is in the process of installation. When the second bolt needs to be tightened, the robot arm 130 performs the necessary correction (i.e., angle, pressure that needs to be applied) when installing the second bolt.

The correction is based on the torque value used in tightening the first bolt and such correction may be coded into the algorithm by empirically determining where the robot arm is in the operation. Once a certain number of bolts are tightened, the tilt characteristic may no longer be at play. As a result, after tightening the certain number of bolts, the robot arm 130 may be positioned in accordance to where the bolt holes 137 are and such positioning is determined independent of the tilt characteristics. It should be noted that for each cycle of torquing value, the robot arm 130 follows the sequence of the specific pattern and performs the necessary correction based on what is dictated by the algorithm.

Using the robot to perform the top plate installation operation results in a consistent and precise installation and takes less time than if the same operation was performed by a human. Further, consistency, precision, order and amount of torque applied by the robot arm are steady and repeatable for the different etch chambers that require such installations. The automated installation process using the robot provides reliable and consistent results that are devoid of any human introduced errors. Error in the installation, such as missing a particular bolt hole or installing out of sequence would result in vacuum leaks, which can cause thermal non-uniformities above wafer and, as a result, impact etch uniformity. The size and maneuverability of the robot arm 130 allows the robot arm 130 to reach and work in confined spaces, making for a more efficient installation.

It should be noted that the robot arm 130 may be programmed to remove a top plate by unscrewing the bolts from the bolt holes, in a similar manner followed when installing a top plate. In one embodiment, the program to control the robot arm 130 for removing the top plate may take into consideration the specific pattern and the specific torque values to apply when removing each of the bolts on the top plate, which may be similar to the process followed for installing the top plate.

Figure 10A:
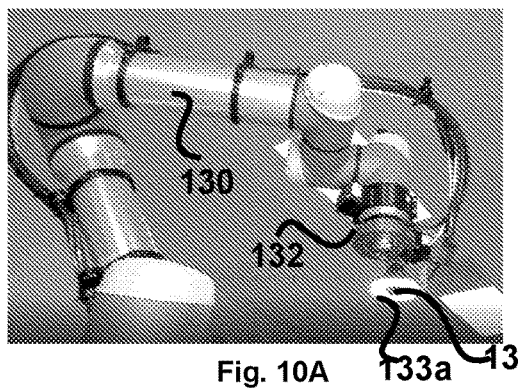
FIGS. 10A-10G illustrate a robot arm of a robot of the robot system used to couple with different end-effectors for use during a maintenance operation, in accordance with one implementation.

FIGS. 10A-10G illustrate the process followed by the robot arm 130 when installing the top plate 194 at the process module, such as an etch chamber. FIG. 10A illustrates a second end of the robot arm 130. The first end of the robot arm is connected to fixture connect interface 122 of the arm frame 114. The second end of the robot arm 130 includes a light fixture 133a and a camera 133b. The light fixture 133a is used to illuminate the site where the robot arm 130 is performing an operation. For example, in the case of the installation of the top plate 194, the light fixture 133a may be used to illuminate the bolt hole 137 at a particular location where the bolt 136 has to be installed and the particular location to position the robot arm 130 with the light fixture may be based on the specific pattern being followed. The camera 133b may be used to take images of the site before, during and after the operation is performed.

Thus, in the case of the bolt installation, the camera may take images of the bolt hole 137 before the bolt is installed, image of the robot arm 130 when installing the bolt 136 in the bolt hole 137 to determine the angle of the robot arm 130 during installation of that particular bolt 136 in the bolt hole 137, and the bolt hole 137 with the installed bolt 136 after tightening. These images may be captured for each bolt and for each cycle and for each installation. Other sensors, such as proximity sensors, lasers, etc., may be used to determine the orientation of the top plate and to assist in the installation and during inspection of the installation task. The second end of the robot arm 130 also includes an end-effector connector 132. The end-effector connector 132 is used to couple to an end-effector available to the robot. In one implementation, the different end-effectors may be housed in separate storage or housings at the frame top 103 of the cart frame 102. A number of end-effectors may be available in the frame cart 102, with each end-effector being used to perform a specific task or function.

Figure 10B:
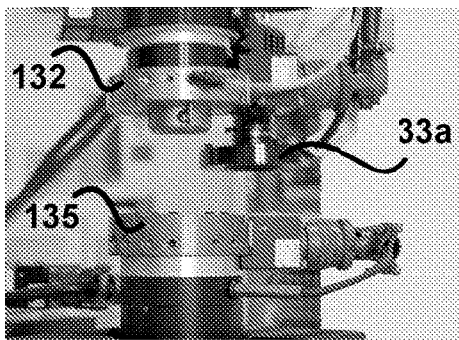
Figure 10C:
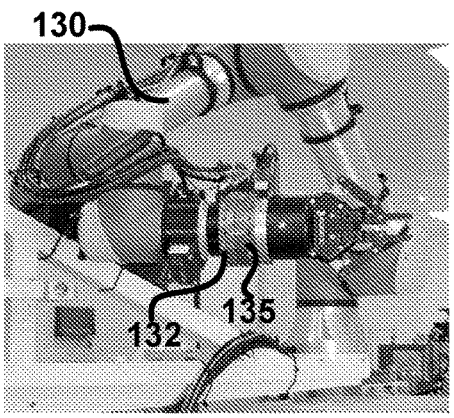
Figure 10D:
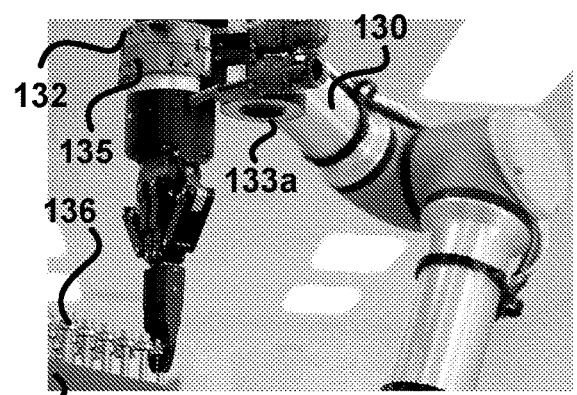
Figure 10E:
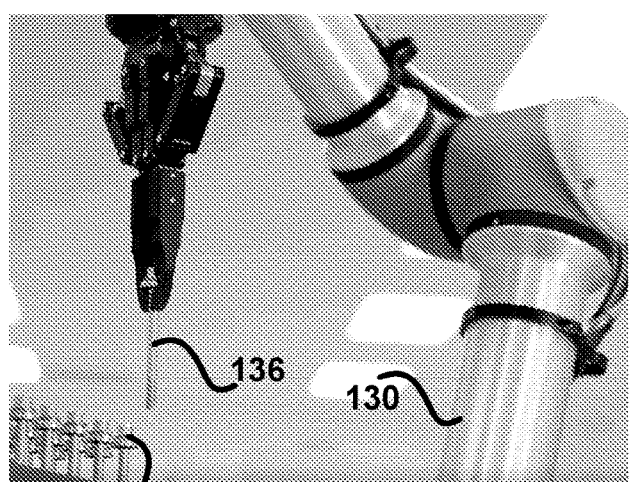
Figure 10F:
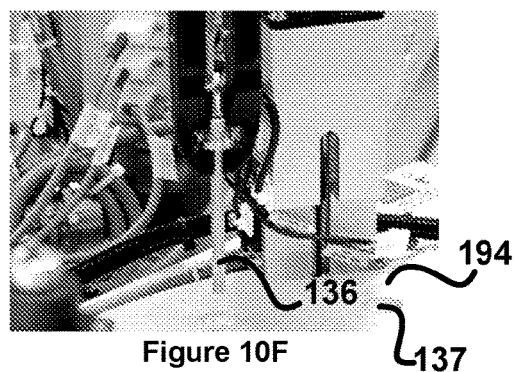
Figure 10G:
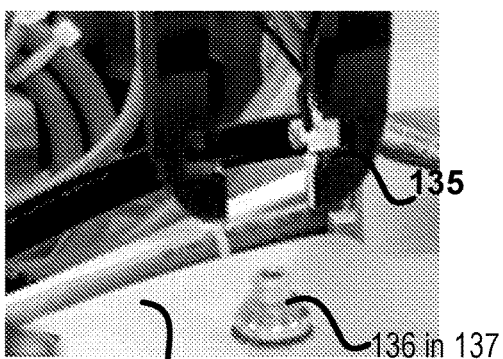

FIG. 10B illustrates the end-effector connector 132 of the robot arm 130 being coupled to an end-effector, which is a bolt interface. The bolt interface includes a bolt grabber end-effector 135 and a screw head end-effector 135'. The bolt grabber end-effector 135 is used to grab the bolts 136 from the bolt box 134 and drop the bolts in the corresponding bolt holes 137 defined on the top plate 194. The number of bolts 136 in the bolt box 134 corresponds to the number of bolt holes 137 defined on the top plate 194. FIG. 10C illustrates the end-effector connector 132 of the robot arm 130 coupled to the bolt grabber end-effector 135 and is in the process of moving toward the bolt box 134 to grab the bolts 136. FIG. 10D illustrates the robot arm 130 with the bolt grabber end-effector 135 grabbing a bolt 136 from the bolt box 134. FIG. 10E illustrates the bolt grabber end-effector 135 moving the bolt 136 from the bolt box 134 toward the bolt hole 137 in the top plate 194. FIG. 10F illustrates the robot arm 130 with the bolt 136 being aligned over the bolt hole 137 in the top plate 194 into which the bolt 136 is to be dropped. FIG. 10G illustrates the bolt grabber end-effector 135 in a released position after dropping the bolt 136 into the bolt hole 137.

Figure 11A:
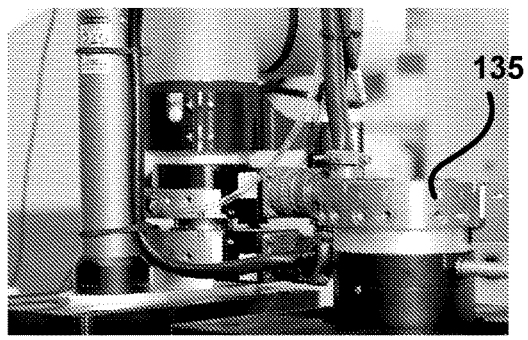
FIGS. 11A-11F illustrate the process followed by a robot arm of the robot system in accessing different end-effectors to install a top plate of an etch chamber, in accordance with one implementation.
Figure 11B:
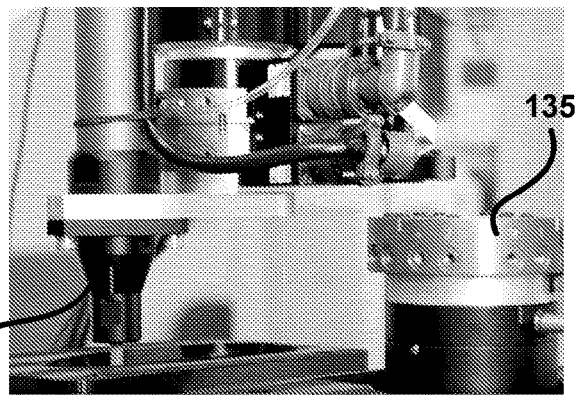

FIGS. 11A through 11F illustrate the process of installing the bolts of the top plate 194, in one implementation. The process of picking the bolts 136 from the bolt box 134 and dropping them into the respective bolt holes 137 was described with reference to FIGS. 10A-10G. Once all the bolts 136 are received in the respective bolt holes 137, the robot arm 130 returns the bolt grabber end-effector 135 to the corresponding end-effector storage 204 defined in a portion of the frame top 103 of the cart frame 102, as shown in FIG. 11A. The robot arm 130 then moves to a second end-effector storage 204 which includes a second end-effector (screw head end-effector 135') that is part of the bolt interface, and the end-effector connector 132 is used to couple to the screw head end-effector 135'. FIG. 11B illustrates the end-effector connector of the robot arm 130 coupled to the screw head end-effector 135' and pulling the screw head end-effector 135' out of its end-effector storage by the robot arm 130. Also shown is the bolt grabber end-effector 135 stored in its own end-effector storage when the robot arm is coupled to the screw head end-effector 135'.

Figure 11C:
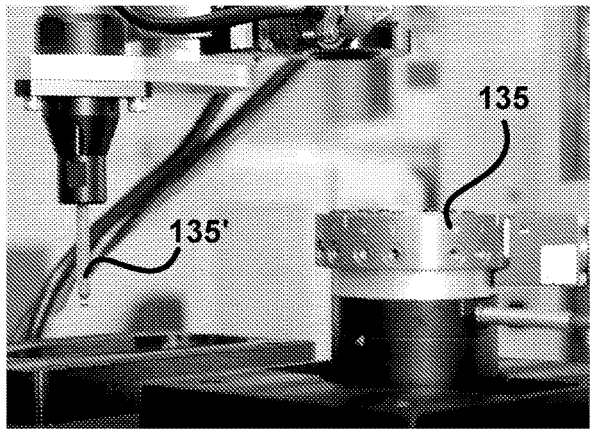
Figure 11D:
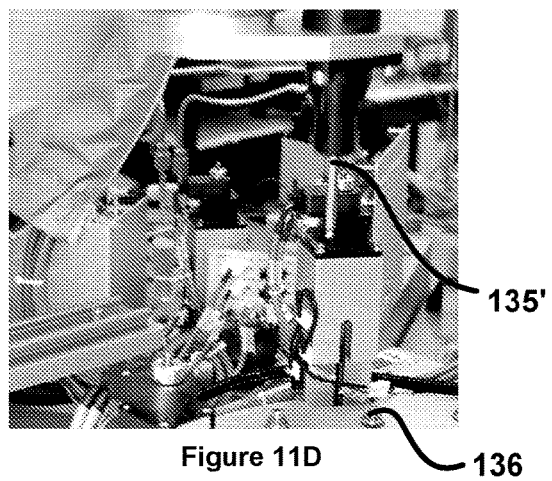
Figure 11E:
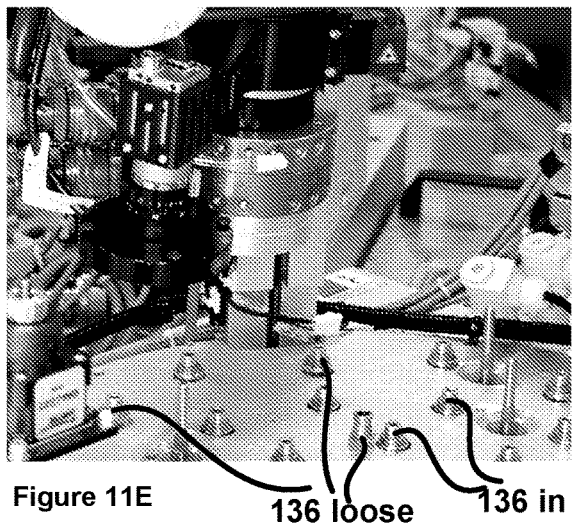
Figure 11F:
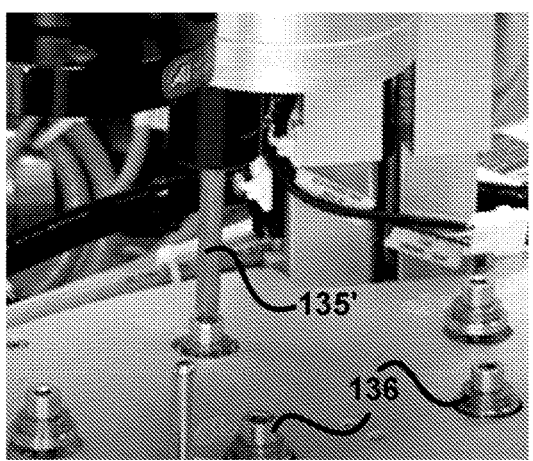

The robot arm 130 moves the screw head end-effector 135' out of its housing, as shown in FIG. 11C and aligns with a bolt hole 137 in the top plate 194, as shown in FIG. 11D. The bolt hole 137 to which the robot arm 130 with the screw head end-effector 135' is aligned is identified in accordance to the specific pattern that needs to be followed during installation, as was described above. FIG. 11E shows a view of the top plate 194 over which the screw head end-effector 135' is aligned. The top plate 194 shows some of the bolts 136 that have been torqued (tight) and some of the other bolts 136 that have not yet been torqued (loose). FIG. 11F illustrates the screw head end-effector 135' in action torquing a bolt 136 as part of installation of the top plate 194. The robot arm 130 with the screw head end-effector 135' installs the bolts following the specific pattern. The algorithm driving the robot arm may adjust the angle of the robot arm 130 with the screw head end effector 135' based on the tolerance calibrated from the tilt characteristics of the top plate 194.

The installation of the top plate 194 is being provided as an example. It should be noted that the robot arm 130 is not restricted to the installation of the top plate 194 in an etch chamber or for performing maintenance on the etch chamber but may be extended to install other components, such as consumable parts, other types of covers, etc., or to perform other maintenance, such as removal of top plates/covers, replacement of consumable parts, inspection of consumable parts, run on-the-spot metrology application, etc., in other process modules that perform other substrate processing operations.

Measurements:

During installation and maintenance of the process modules, various measurements may need to be taken into consideration. For example, during installation, the wafer pocket depth, lifter pin heights, edge ring concentricity, etc., may need to be considered. These measurements may be used to determine the wear of the consumable parts, which can then be used to determine when the consumable parts need to be replaced or serviced. The robot may be used to determine and record these measurements by using sensors, such as Lidars, proximity sensors, cameras, etc. Automating collection of such measurements leads to having more precise measurements and such measurements are possible without requiring expensive digital gauges or crude shims Further, such measurements can be gathered easily and accurately using vision system of the robot arm 130, as the robot arm 130 can be easily maneuvered within the confined space of a process module without damaging any components or requiring a skilled operator.

Chamber Cleaning:

The robot arm 130 may be programmed to autonomously clean the chamber sidewalls by implementing computer vision and machine learning. The cleaning is done in accordance to pre-defined standards. One or more cameras of the vision system, once activated, captures ultra-high-resolution images of the chamber sidewall and the machine learning algorithm is engaged to identify areas on the sidewall that will need cleaning. The robot system 100 then autonomously directs a cleaning end-effector (e.g., a scraper, a brush, a $CO_2$ dispenser, such as a dry ice gun and vacuum nozzle, etc.,) that is coupled to the end-effector connector 132 of the robot arm 130 to clean the identified area and to remove the polymer residues and other particulates that may have accumulated during various operations performed within the chamber. After an initial scrub, images of the inside of the process module are captured using cameras and other image capturing devices coupled to the end-effector connector of the robot arm 130. The captured images are analyzed in substantial real-time to determine if the cleaning meets the pre-defined metrics. If the cleaning does not match the pre-defined metrics, additional cleaning is done and the process is repeated till the standard of cleaning is met. The algorithm controlling the robot arm 130 can be specified with the level of cleanliness required during chamber clean and the robot arm 130 is controlled to follow the cleanliness specificity.

Figure 12A:
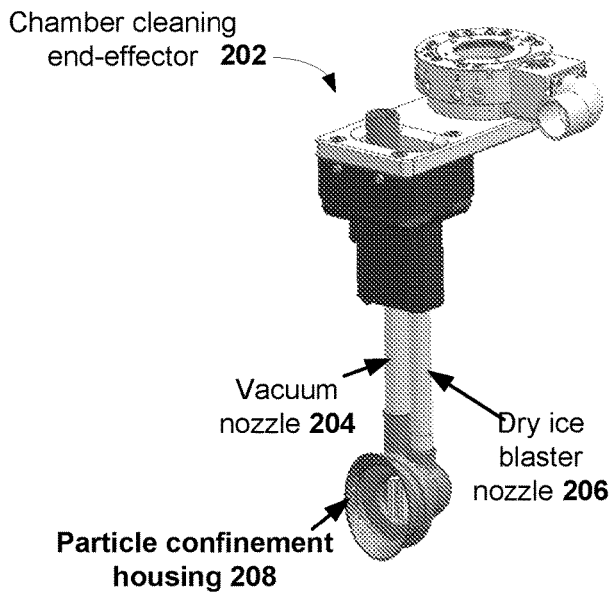
FIG. 12A illustrates an example chamber cleaning end-effector that can be attached to a robot arm of the robot system to clean inside surfaces of a process chamber, in accordance with one implementation.

FIG. 12A shows an example chamber cleaning end-effector 202 that can be coupled to the end-effector connector 132 of the robot arm 130 and used to clean the inside sidewalls of a process chamber (e.g., a process module). The example cleaning end-effector 202 uses a dry ice gun to blast dry ice toward the inside sidewalls of the process chamber to release the particulates that have adhered to the sidewalls and apply vacuum to remove the released particulates. Accordingly, the chamber cleaning end-effector 202 includes a dry ice blaster nozzle 206 and a vacuum nozzle 204. The blaster nozzle 206 is configured to blast dry ice toward a section of the sidewall of the process chamber which needs cleaning by positioning the chamber cleaning end-effector to face the section and then blasting the section with dry ice so as to release the particulates from the sidewalls. The vacuum nozzle 204 is configured to provide a suction force to promptly remove the released particulates. A particle confinement housing 208 provided at the end of the chamber cleaning end-effector 202 is used to capture and remove the particulates as the particulates are released from the sidewalls by the dry ice blast. The particle confinement housing 208 may include holes or conduits through which the vacuum is applied to suction out the released particulates. The dry ice is one state of $CO_2$ that can be used to clean the inside sidewalls of the process chamber using the chamber cleaning end-effector 202 and other states of $CO_2$, such as liquid $CO_2$, or $CO_2$ plasma, etc., for cleaning the can also be envisioned. Although use of $CO_2$ has been discussed as the cleaning chemistry for cleaning the inside sidewalls of the process chamber, it should be noted that the cleaning chemistry is not restricted to $CO_2$ and that other cleaning chemistries can also be used. The position of the chamber cleaning end-effector 202, the force used to blast the cleaning chemistry, such as dry ice through the dry ice blaster nozzle 206, and the amount of vacuum applied via the vacuum nozzle 204 to the particle confinement housing 208 may be programmed into the robot system 100 and the level of clean achieved using the chamber cleaning end-effector 202 may be verified using the ultra-high-resolution images captured by the cameras of the vision system. The programming is used to control movement of the robot arm 130 with the chamber cleaning end-effector 202 into and inside the process chamber in order to access the different sections of the process chamber and to control the cleaning so as to achieve the standard of cleaning defined for the process chamber. In some implementations, the chamber cleaning end-effector 202 may have to perform certain number of cleaning cycles before reaching the desired standard of cleaning.

Figure 12B:
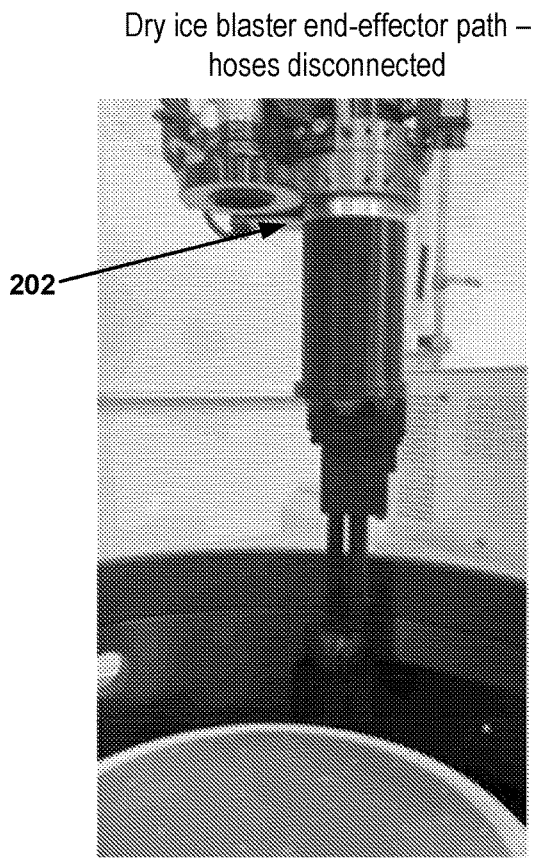
FIG. 12B illustrates an example chamber cleaning end-effector with hoses supplying dry ice and vacuum disconnected, in accordance with one implementation.
Figure 12C:
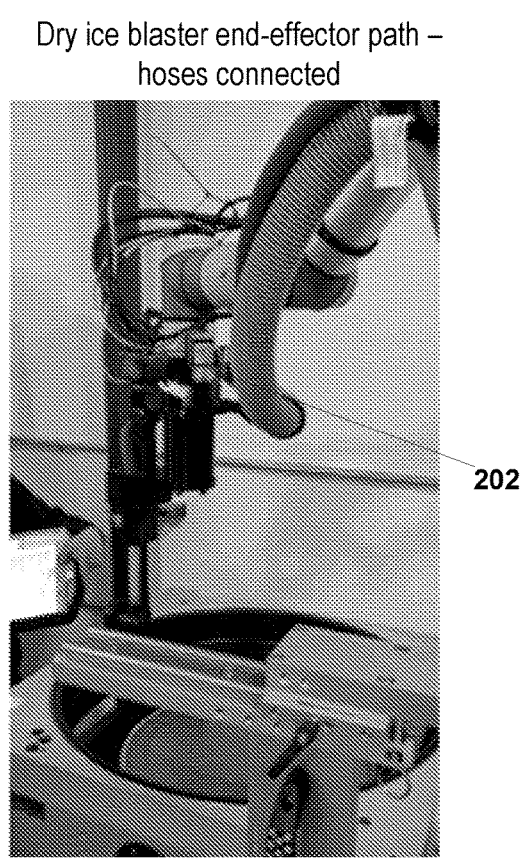
FIG. 12C illustrates an example chamber cleaning end-effector with hoses supplying dry ice and vacuum connected, in accordance with one implementation.

FIG. 12B illustrates an example chamber cleaning end-effector 202 without any hoses connected and FIG. 12C illustrates an example chamber cleaning end-effector 202 with the hoses connected. The robot system 100 is programmed to control the path followed by the robot arm 130 with the chamber cleaning end-effector 202 taking into consideration the hoses connected to the chamber cleaning end-effector 202 in order to prevent damage to the chamber cleaning end-effector 202 and the chamber insides. The standard of clean defined for the chamber determines the clean time needed and the level of clean that has to be achieved.

For example, metrics may be set for the robot arm 130 specifying that the cleaning may leave particles that are less than or equal to 10 micron sizes and the robot arm 130 will follow the set metric. Robot system enables standardization of the cleaning process where the definition of clean can be specified (e.g., number of a given maximum size particles per square centimeter of chamber wall) and customized for each chamber, if needed. This reduces the variability associated with humans having different levels of experience in performing the chamber clean. Further, the automation avoids humans being exposed to harmful vapors or particles.

Parts Inspection:

The robot arm 130 can be used to inspect the parts used inside a tool (e.g., process module or chamber) to determine the amount of wear or damage, the amount of life left, and to perform customized predictive maintenance. The vision system disposed on the robot arm is configured to inspect parts for defects of pre-defined sizes and features before having to replace or service the parts. The vision system can also be used to measure erosion rates of consumables and predict the next maintenance cycle for each chamber individually. The vision system can also validate installation quality and completeness by checking installed consumable parts, such as gaskets, O-rings, edge rings, bolts, cover rings, and other parts, and ensuring that these parts are installed correctly. Record of the metrics collected during inspection may be used to identify location of a perceived problem and, in some cases, autonomously take corrective actions. For instance, in the case of an edge-ring misalignment, the robot arm can be used to correct the defect by re-centering the edge ring.

Further, the part inspection can be used to optimally use the consumable parts. Usually the consumable parts come with a standard lifetime. However, to be on the safe side, the lifetime estimate is defined very conservatively, making this very inefficient. For example, an edge ring may be able to withstand couple of thousand RF hours in the chamber. However, to ensure that etch standard does not get compromised, the lifetime estimate may be set at 600 hours, for example, requiring that the edge ring needs to be switched out before the lifetime of the edge ring has been met. In order to avoid under-utilizing the consumable parts, the consumable parts are scanned using the laser scanner and other sensors, before the start of a process cycle, and after each process cycle to determine erosion rate, by comparing the profile of the edge ring before and after the process cycle. The erosion rate may be determined for the particular chamber and for the particular edge ring. Based on the determination, the consumable parts may be replaced, thereby enabling optimal use of the consumable parts.

Consumable Part Installation:

The robot system 100 can also be used to install consumable parts, such as cover rings, edge rings, etc., where precision installation is desired. A separate consumable part installation end-effector may be used to pick the consumable part from a consumable part storage pod and precisely place it in the desired location within the process chamber to ensure that the consumable part is placed with optimized gap spacing all around. In one implementation, the top plate 194 of the process chamber is removed using the robot arm 130 providing access to the inside of the process chamber. In other implementation, the top plate 194 of the process chamber may be removed by other means, including manually. Then the consumable part installation end-effector is used to remove the used consumable part from the process chamber and replace the removed consumable part with a new consumable part retrieved from a storage pod, for example.

FIG. 13A illustrates an example consumable part installation end-effector 212 that can be coupled to the end-effector connector 132 of the robot arm 130 and used to pick and remove a used consumable part out of the process chamber as well as to replace the used consumable part with a new consumable part within the process chamber. The consumable part may be an edge ring, a cover ring or any other part that can be accessed and replaced. The consumable part installation end-effector 212 includes a gripper component 214 that is used to pick and move the consumable part, such as a cover ring or an edge ring disposed in the process chamber. In one implementation, the cover ring may be made of quartz. In other implementations, the cover ring may be made of any other material that is conducive to the conditions of the process chamber to which the cover ring is exposed. In one implementation, the edge ring may be made of silicon. In other implementations, the edge ring may be made of any other suitable material that can withstand the conditions of the process chamber and provide the functionality that it is designed for. The robot arm 130 with the consumable part installation end-effector 212 is programmed to pick the cover ring 214a, for example, from a stand or a storage pod, move the cover ring into the process chamber and place the cover ring so as to fit over the edge ring. In one implementation, the cover ring may be pressed into position to ensure that a desired gap exists around the cover ring after installation and that the gap is uniform all around.

To assist in picking, moving and installing the consumable part, the consumable part installation end-effector 212 includes a gripper component 214. The gripper component 214 includes a central component 215 and a peripheral component 216. The central component 215 extends along a diameter of the consumable part installation end-effector 212. In one implementation, the central component 215 is a solid piece without any channels defined therein and is defined to have a length that is smaller than the diameter of the consumable part installation end-effector 212. The peripheral component 216 extends from an outer edge of the central component 215 along the diameter of the consumable part installation end-effector 212. The peripheral component 216 may include a plurality of openings that are defined to extend from a top surface through the body of the peripheral component 216 to a bottom surface of the peripheral component 216. The plurality of openings is defined uniformly along the length of the peripheral component 216. The set of channels are used to provide the gripping force for picking the consumable part. The gripper component 214 is connected to a vacuum component.

The vacuum component includes a vacuum tube 217a that extends radially from a first end defined at the center of the consumable part installation end-effector 212 to a second end proximate to the edge of the consumable part installation end-effector 212. The first end of the vacuum tube 217a defined at the center is coupled to a vacuum source that is used to provide sufficient vacuum force during operation of the consumable part installation end-effector 212. The second end of the vacuum tube 217a is coupled to a vacuum conduit 217b that is defined as a ring along the edge of the consumable part installation end-effector 212. The vacuum tube 217a is a hollow tube through which vacuum can be applied to the gripping surface defined along the bottom of the gripper component 214. A first set of outlets 218 is defined to extend between a bottom surface of the vacuum conduit 217b and a top surface of the peripheral component 216, wherein each of the first set of outlets 218 aligns with a corresponding opening defined in the peripheral component 216. In one implementation, the number of outlets in the first set 218 is equal to the number of openings defined in the peripheral component 216. A second set of outlets 219 is defined to extend between a bottom surface of the peripheral component 216 and through a gripper surface defining the bottom of the consumable part installation end-effector 212. The second set of outlets 219 is defined to align with the corresponding openings defined in the peripheral component 216. The second set of outlets 219 define openings in the gripper surface through which the vacuum is applied to provide a suction force for gripping the consumable part. In alternate implementation, instead of separately defining a first set of outlets 218, the plurality of openings in the peripheral component 216 and a second set of outlets 219, a single set of outlets may be defined to extend from a bottom surface of the vacuum conduit 217b and through the peripheral component 216 to the gripper surface of the gripper component 214 of the consumable part installation end-effector 212.

During operation, the vacuum source is used to provide appropriate vacuum through the vacuum component (i.e., through the vacuum tube 217a and vacuum conduit 217b) and the openings in the peripheral component 216 and the gripper surface, which translates to a suction force that can be used to reliably grip and lift the consumable part, such as the edge ring, cover ring, etc., into and out of the process chamber.

FIG. 13B shows the consumable part installation end-effector 212 in action, wherein the gripper surface consumable part installation end-effector 212 is engaged to apply the suction force using vacuum generated from a vacuum source to grip a cover ring 214a. The cover ring 214a may be picked from a cover ring storage (not shown) for installing over an edge ring 214b disposed within the process chamber. The cover ring 214a is then moved into the process chamber and positioned over the edge ring 214b disposed over an electrostatic chuck (ESC), for example, using an angled approach. Once the cover ring is over the edge ring 214b, the cover ring 214a is lowered into position. The alignment of the cover ring over the edge ring 214b is verified by the vision system of the robot arm 130. For example, the one or more cameras included in the robot arm are used to identify location of the various components of the process chamber and the location where the cover ring needs to be placed in relation to the components of the process chamber. Based on the information obtained from the images captured by the cameras, the installation end-effector 212 of the robot arm 130 with the cover ring 214a is moved into position over the edge ring 214b. Once the cover ring 214a is placed in position over the edge ring 214b, the one or more cameras of the robot arm 130 are used to verify that the cover ring 214a is placed in position and a uniform gap exists between the cover ring 214a and the edge ring 214b. During verification, if an incorrect offset exists, a signal is generated to the robot arm to correct the offset. The robot arm with the installation end-effector 212 moves to correct the offset and to ensure that a desired gap exists all around the cover ring 214a and the gap is uniform. The process of verification is performed till the desired gap all around is achieved.

FIGS. 13C and 13D illustrate the consumable part installation end-effector 212 in action during installation of an edge ring, in one example implementation. FIG. 13C illustrates the gripper component 214 holding the edge ring 214b and approaching the inside of the process chamber for installation, wherein the top plate 194 of the process chamber has been removed to provide access to the inside of the process chamber. FIG. 13D illustrates the edge ring 214b installed in position over an electrostatic chuck (ESC) 221, for example, disposed within the process chamber, in one example installation. The edge ring 214b is placed with precision so as to have optimal gap (i.e., spacing) defined around the edge ring 214b and between the edge ring 214b and the ESC 221 of the process chamber. In some example implementation, the placement of the edge ring has to be precise in order to define a gap that is between about 75 micro meters (μm) and about 125 μm present all the way around the edge ring.

Gel Installation:

Gels are used in the installation of an edge ring within a process module. Gel installation is a delicate process that requires implementation of specific, lengthy and cumbersome techniques to ensure precise installation of the gels. Improperly installed gel inhibits thermal contact to the edge ring and affects its height relative to the electrostatic chuck over which it is received. Additionally, improper installation of the gel may cause the edge ring to get adversely exposed to the plasma, thereby adversely affecting the integrity and the lifetime use of the edge ring. In one implementation, strips of gel rings are defined using a mold (for example, a gel tray). These gel ring strips are then carefully removed from the gel tray and placed along a length of an edge ring. To ensure proper placement of the gel ring strips, the edge ring may be divided into a plurality of sections and the gel ring strips removed from the gel tray are placed over each section carefully. After placing the gel ring strips on the edge ring, the backing of the gel ring is carefully peeled. The placement and peeling have to be done carefully in order to ensure the delicate, thin strips are not damaged or moved (i.e., the gel strips are installed to provide sufficient gap in-between (i.e., there are no overlaps)). Further, the placement and peeling has to be done carefully to ensure there are no air-bubbles underneath.

Figure 14A:
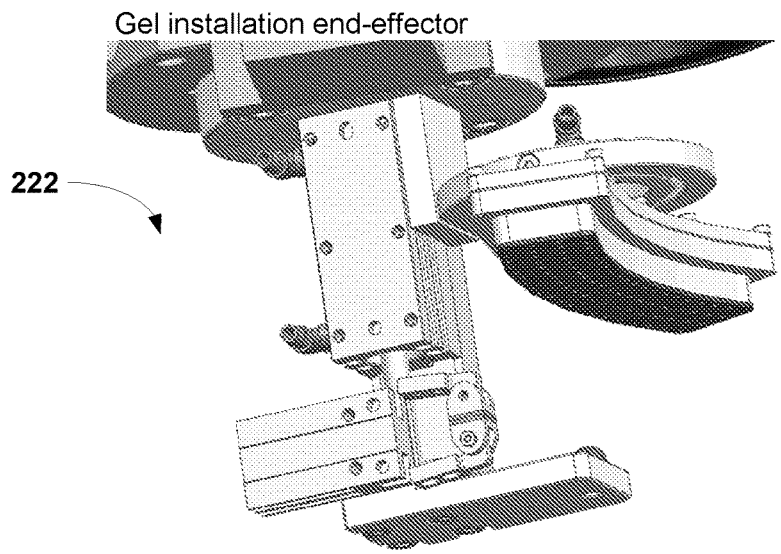
FIG. 14A illustrates an example gel installation end-effector, in accordance with one implementation.

FIG. 14A illustrates an example gel installation end-effector 222 that can be engaged by the robot arm 130 for precision application of the gel ring strips on an edge ring disposed on a top surface of the ESC, for example. The robot arm 130 with the gel installation end-effector 222 allows for careful installation of the gel ring strips to ensure that the gel ring strips provide reliable thermal contact with the edge ring, thereby preserving the etch uniformity and the edge ring integrity. The robot arm 130 with the gel installation end-effector 222 can be trained to perform the gel installation to follow positional accuracy/repeatability.

Figure 14B:
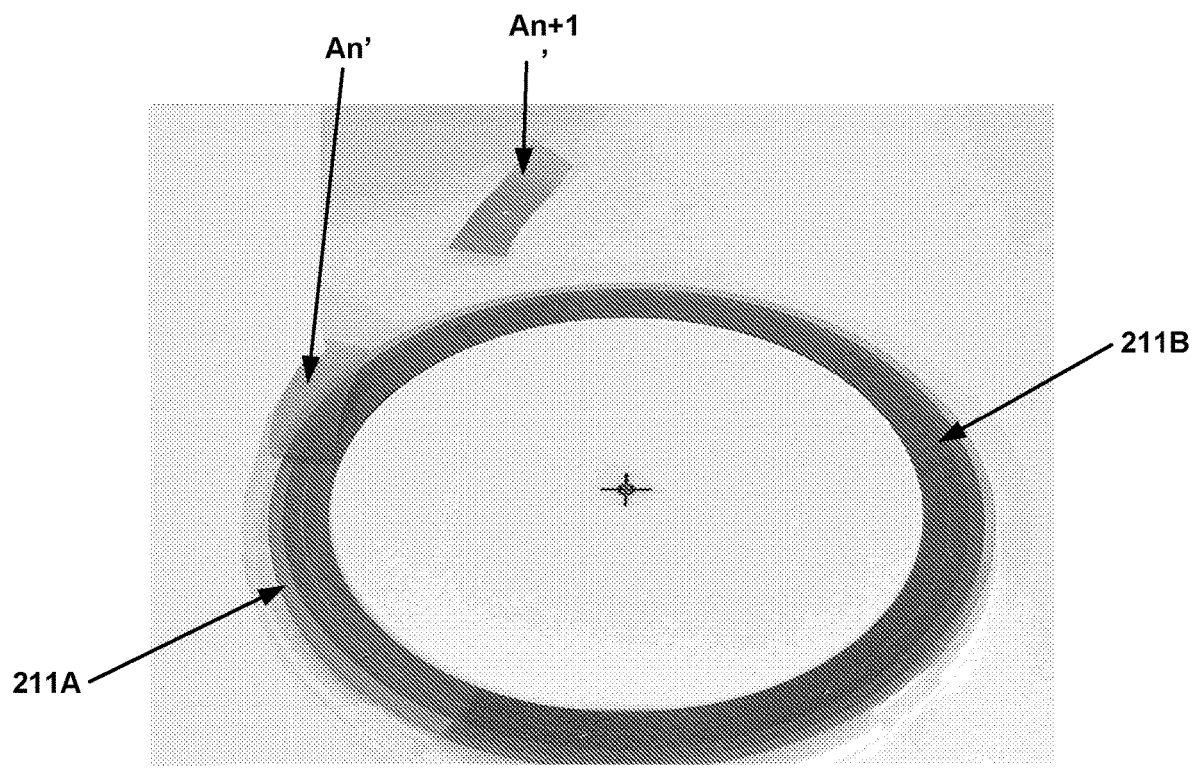
FIG. 14B illustrates a placement and peeling operation being performed, in accordance with one implementation.
Figure 14C:
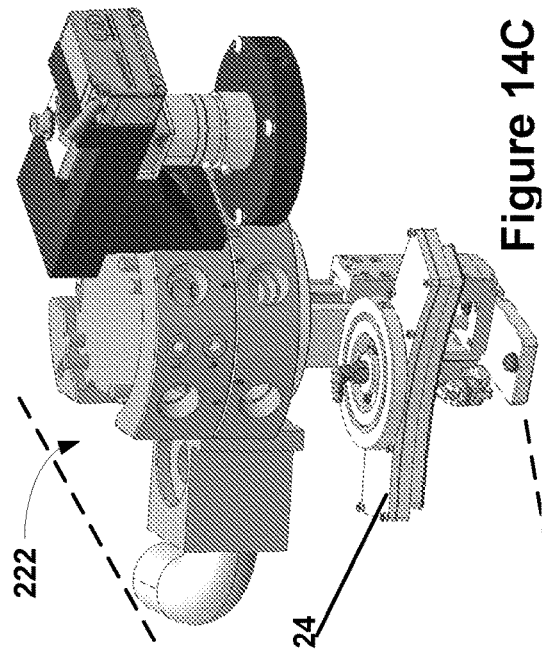
FIG. 14C illustrates a close-up view of the gel installation end-effector as it picks up gels from a gel tray and then installs them on the edge ring on a stand near by, in accordance with one implementation.
Figure 14D:
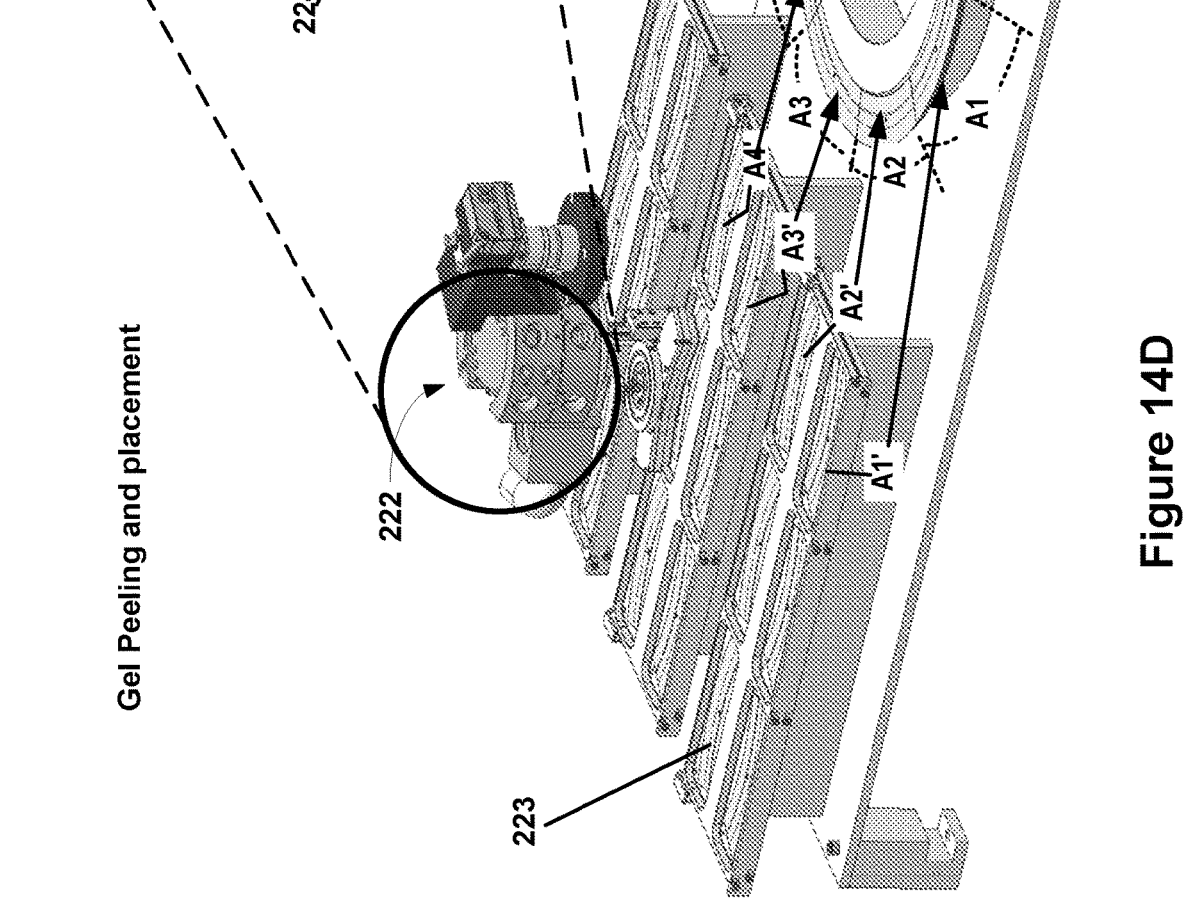
FIG. 14D illustrates an edge ring as it rests on a stand, wherein the gel installation end-effector has been used to place the gel on the edge ring and peel a backer of the gel, in accordance with one implementation.

FIGS. 14B-14D illustrate an example placement and peeling of gel ring strips over the edge ring 214b using the gel installation end-effector 222, in one example implementation. As shown in FIG. 14B, the gel ring strips are defined on a mold (e.g., a gel tray). When the gel ring strips are to be installed, the gel ring strips are carefully lifted from the gel tray, moved over and placed on appropriate sections defined on the edge ring 214b. FIG. 14B shows the peeling operation while installing the gel ring strips An', An+1', wherein the peeling operation is to remove the backing included in the gel ring strips. It should be noted that FIG. 14B shows two gel ring strips An' and An+1' being retrieved for installation at the same time in order to show the sequence of the installation operation. In reality, the gel ring strips are installed one at a time using the gel ring installation end-effector 222, and not simultaneously. The top perspective view shows a portion 211A along the edge ring 214b on which gel ring strips are yet to be installed and a portion 211B on the edge ring 214b on which the gel ring strips (e.g., A'-An−1') have already been installed.

FIG. 14C shows a close-up view of the gel installation end-effector 222 as it picks up gel ring strips from the gel tray for installation on the edge ring 214b, in one example implementation. The gel installation end-effector 222 is used to place standard gel ring strips over the edge ring. The gel ring strips have to be precisely installed so as to leave a gap between adjacent gel ring strips. In some implementation, the gap between the adjacent gel ring strips may have to be between about 10 mils (i.e., about 250 μm) and about 30 mils (i.e., about 765 μm). The location and placement of the gel rings on the edge ring 214b has to be controlled to ensure that the gel ring strips are applied to properly cover an area of an appropriate section defined on the edge ring 214b. It is to be noted that the aforementioned dimensions for the gap have been given as an example in order to show how precisely the gel ring strips have to be applied using the gel installation end-effector 222 coupled to the end-effector connector 132 of the robot arm 130. These dimensions should not be considered restrictive. In this implementation, the edge ring 214b is received on a stand that is brought proximate to the gel tray so that the gel installation end-effector 222 can remove the gel ring strips from the gel tray and position over appropriate sections of the edge ring 214b received on the stand.

FIG. 14D illustrates the edge ring 214b as it rests on the stand and the gel installation end-effector 222 as it hovers over the gel tray to remove a gel ring strip for placing over a section defined on the edge ring 214b received on the stand, in one example implementation. To begin with a plurality of gel ring strips are defined on the gel tray 223 or any other surface that is designed for defining the gel ring strips. FIG. 14D shows an example gel tray 223 with a plurality of gel ring strips A1', A2', A3', A4', etc., defined thereon. The top surface of an edge ring 214b is shown to have been received on a stand alongside the gel tray 223 with the gel ring strips. The top surface of the edge ring 214b is divided into a plurality of sections. The sections are all equal in dimensions to one another and the gel ring strips defined on the gel tray 223 are defined to have dimensions that are the same as the dimensions of the sections defined on the edge ring 214b. FIG. 14D shows one example wherein sections A1, A2, A3, A4, etc., are defined on the edge ring 214b. In alternate implementation, the sections may not all be equal in dimensions. In the implementation where the sections defined on the top surface of the ESC are equal in dimension and the gel ring strips dimensions match the dimensions of the sections, the gel installation end-effector 222 is used to remove each gel ring strip from the surface of the gel tray 223 and place it in appropriate section defined on the edge ring 214b. Since each gel ring strip is thin and delicate, the gel installation end-effector 222 is equipped with appropriate tool to carefully remove each gel ring strip from the gel tray 223 without damaging the gel ring strip.

The removed gel ring strip is then carried over to an appropriate section defined on the top surface of the edge ring 214b and the gel installation end-effector 222 is lowered so that the gel ring strip can be placed over the section. Thus, gel ring strip A1' is placed over section A1 on the edge ring 214b, gel ring strip A2' placed over section A2, gel ring strip A3' placed over section A3, and so on. The positioning of the gel installation end-effector 222 over appropriate section of the edge ring 214b can be precisely controlled by programming the robot arm 130 and the position verified using the vision system and image capturing devices disposed on the end-effector connector of the robot arm 130. Upon successful verification, the gel installation end-effector 222 is lowered over the section and the gel ring strip carried by the end-effector 222 is placed and pressed into position over the section. The gel installation end-effector 222 may include a carrying member 224 that is arched to match the arch of each section defined on the edge ring. The arch-shaped carrying member 224 can be moved radially to position over any section, during installation, so that the orientation of the arch-shaped carrying member 224 matches with the orientation of the section on which the gel ring strip is to be installed. After installation of the gel ring strip over the appropriate section defined on the edge ring 214b, a backing included in the gel ring strip is carefully peeled.

It is to be understood that the robot arm 130 with the gel installation end-effector 222 can be programmed for precision application of the gel ring strips. The gel installation using the gel installation end-effector 222 is done to minimize the air bubble concentration at the installed gel ring-edge ring interface. The robot arm 130 can be controlled so as to provide precise pressure for applying the gel rings at the appropriate sections over the edge ring. The precise application can be controlled for repeated applications by programing the robot arm 130 and such precision is hard to get using manual method.

The aforementioned uses have been provided as examples and other processes during installation and maintenance applications that involve repeatability, considerable challenges and risks attributed to human variability (skills, experience, expertise, etc.) can be performed by the robot system. Further, the aforementioned uses and the end-effectors used to perform the applications/services are provided as examples and should not be considered restrictive. It should be noted that additional applications/services, and other end-effectors or variation in the design concepts of the aforementioned end-effectors for performing the various applications/services can also be envisioned.

Figure 15B:
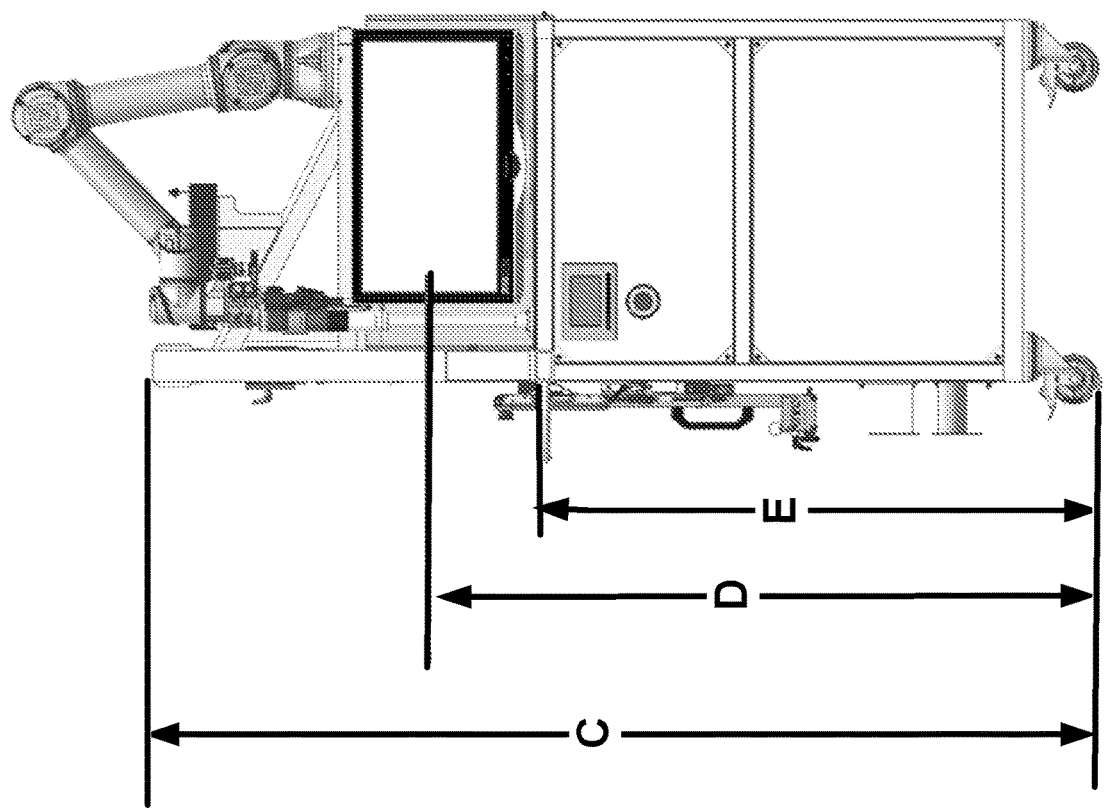
FIG. 15A illustrates an overhead view cart and FIG. 15B illustrates a side view of the robot system installed on a cart showing some of the dimensions, in accordance with one implementation.
Figure 15A:
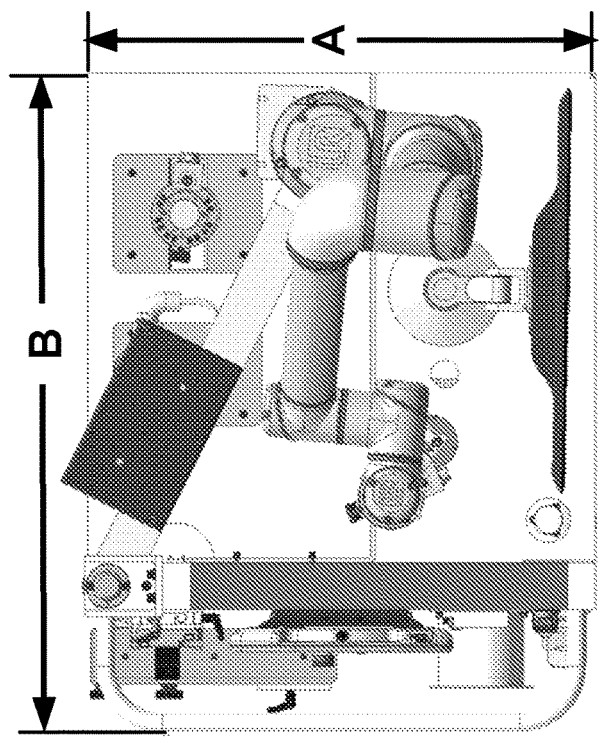

FIGS. 15A and 15B identify sample dimensions of a robot system disposed on a cart for performing various repeatable installations and servicing of different components of a process chamber, in some example implementations. FIG. 15A shows an overhead view of the robot system disposed on the cart. The dimension of the cart with the robot system may be defined by a width 'A' and a length In one example implementation, the width A of the cart with the robot system installed is between about 635 mm (about 25 inches) and about 760 mm (about 30 inches) and the length B of the cart with the robot system is between about 812 mm (about 32 inches) and about 965 mm (about 38 inches). FIG. 15B illustrates a side view of the cart with the robot system identifying the heights of different components of the cart and the robot system, in one example implementation. In one implementation, the height from floor to top of the robot system disposed on the cart is defined by height 'C', which is defined to be between about 1825 mm (about 72 inches) and about 1955 mm (about 77 inches). In one implementation, the height from floor to center of monitor disposed on the top surface of the cart is defined by height 'D', which is defined to be between about 1245 mm (about 49 inches) and about 1345 mm (about 53 inches). In one implementation, the height from floor to cart handle of the cart on which the robot system is disposed is defined by height 'E', which is defined to be between about 1065 mm (about 42 inches) and about 1145 mm (about 45 inches). It is to be noted that the aforementioned dimensions are provided as mere examples and should not be considered restrictive. Other dimensions can also be envisioned based on the size of the process chamber, height of the process chamber, the area available around the process chamber, type of end-effectors that are being used, type of maintenance that is to be performed, and other spatial and process limitations of the tool and the robot system.

The robot system discussed herein is an autonomous mobile semiconductor equipment installation and maintenance tool that can be used in a semiconductor fabrication facility to perform repeatable operations (i.e., tasks) such as assembly, maintenance, wet clean, metrology, on-the-spot inspection, validation, etc. In one implementation, the robot system and the cart are powered by battery, wherein the battery is included in the cart frame 102 on which the robot arm 130 is disposed. The battery may be part of the DC power supply that is housed in the cart frame 102 and used to power components, such as computer, etc., disposed on the cart, or may be a separate power supply used to power the cart and the robot arm 130. The battery-sourced power provides greater flexibility for the robot system as it is easier to maintain and saves operator time. In an alternate implementation, the robot system may be powered using plug-in power source. The plug-in power source may be part of the AC power supply included in the cart frame 102 to power other components or may be a separate power supply to power the robot and/or the cart. Data collected from the robot is used by machine learning (i.e., AI algorithm) for predicting maintenance schedules for the different chambers. The actions and sequences of an operation are learnt and coded into an algorithm that controls the robot arm.

In one embodiment, operations performed by the robot are controlled by a computer program. The computer program provides the process by which the robot will perform each movement to complete the desired servicing operation. The program guides the robot by providing detailed instructions for performing each movement (e.g., details related to location, speed, height, distance, direction, etc., the robot arm has to be moved) of the desired servicing operation. In alternate embodiment, the operations of the robot are controlled by machine learning, wherein process operations performed by various robots at different process modules are gathered from across the floor of the fabrication facility. The information gathered from various robots is analyzed to build and train AI models. The AI models can be queried to determine the process a robot will have to follow to perform the desired servicing operation on a particular process module. The machine learning is optional and may be used to optimize the use of the robot and the maintenance of the process modules.

Various advantages of using robotics include performing repetitive assembly, installation and maintenance processes and automation of such tasks can be achieved with improved precision, repeatability, speed and minimal variability. The vision system of the robot arm is used to validate the accuracy of performed tasks, run on-the-spot metrology applications to accurately detect defects, wear, state of components, etc., so that the consumable parts and the chamber can be used optimally. Data related to each operation performed by the robot can be used in diagnostics, installation and maintenance standardization, and customized predictive maintenance. Predictive maintenance can be done using machine-learning.

In some embodiments, machine-learning can be used to predict with greater accuracy and confidence the correctness of a servicing operation performed by the robot system. By way of example, as the robot system performs more operations (e.g., cleaning operations, etc.), metrics associated with the operations can be processed to extract characterizing features using one or more classifiers. The extracted features are then processed by a machine learning model to identify patterns and generate predictions. In one embodiment, the predictions can be processed using one or more rules to take actions. An action, for instance, can be for the robot system to continue cleaning a particular part when the model predicts that additional cleaning would be needed based on its learning. Another action, for instance, can be adjustment to the amount of torque applied to bolts when the robot system installs parts.

In the examples mentioned above, the install part includes a top plate of a process module. However, it should be understood that the parts that can be installed or uninstalled using the robot system can vary widely, depending on which part or subpart of a process tool, process module or component needs some type of servicing. Broadly speaking, as the robot tool processes more operations, features extracted by the classifiers can be used to continually train the model and improve the model's predictions or actions taken responsive to the model processing. In some embodiments, the machine-learning (i.e., AI) model may use a supervised learning (i.e., AI) algorithm that detects features associated with the various states of service performed based on sensor data. As mentioned above, the sensors used by the robot system can include, but are not limited to, vision systems that use one or more cameras or image capturing devices, motion sensors, gyroscopes for inertial sensor processing, pressure sensors, temperature sensors, speed sensors, torque sensors, power sensors, leveling sensors, and combinations of two or more sensors.

The output from the various sensors can be monitored in real time or processed in batches. In some embodiments, multiple robot systems can be monitored at the same time locally or from remote fabrication facilities. The robot systems, for instance, may include wireless or wired network connections that enable sharing of information and remote processing of data for machine learning and training. By using data from multiple robot systems, it is possible to grow the training data and improve the predictions made by the machine learning model.

By improving the machine learning model, the accuracy of the predications, which represent data that actions can be based on, will improve. That is, over time, it may be determined that the robot system needs to apply more torque on certain bolts to keep a part secure, or the robot system needs to clean for an additional amount of time on the left side of the chamber liner, or the robot needs to reduce the amount of scrubbing around the lower electrode rim, or the robot needs to remove certain screws or bolts in a new pattern to avoid tilt of a part, or the robot needs to lift one part out before removing another, or the robot needs to use a different cleaning end-effector to remove certain particulates after particular process operations, or the robot needs to run a camera inspection after cleaning the dielectric window, or the robot system needs to use two robot arms to improve removal of certain parts during service, etc. As can be appreciated, using a machine learning model, it is possible to improve the operation of the robot system to obtain improved operational efficiencies.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by a process that is engineered to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a host computer system within a fabrication facility, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system (e.g., robot system) from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a fabrication facility or factory, a main computer, another controller, or tools used in material transport that bring containers of wafers or substrates, consumable parts, etc., to and from tool locations and/or load ports in a semiconductor manufacturing factory.

Figure 16:
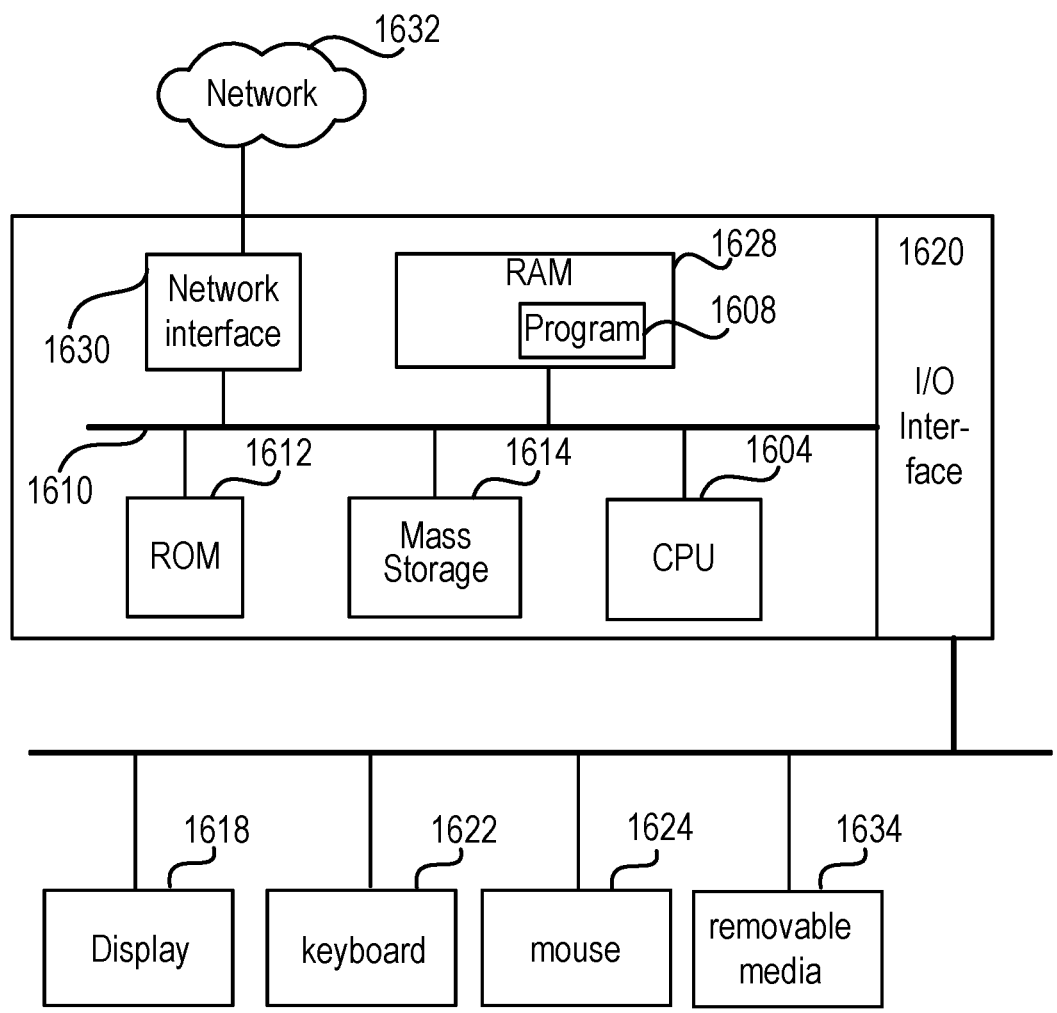
FIG. 16 illustrates a simplified schematic diagram of a computer system for implementing embodiments.

FIG. 16 is a simplified schematic diagram of a computer system for implementing embodiments. By way of example, some of these components may be part of the controller or part of a separate computer used to execute operations associated with the disclosed embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 1604, which is coupled through bus 1610 to random access memory (RAM) 1628, read-only memory (ROM) 1612, and mass storage device 1614. System controller program 1608 resides in random access memory (RAM) 1628, but can also reside in mass storage 1614.

Mass storage device 1614 represents a persistent data storage device such as a floppy disc drive or a fixed disc drive, which may be local or remote. Network interface 1630 provides connections via network 1632, allowing communications with other devices. It should be appreciated that CPU 1604 may be embodied in a general-purpose processor, a special purpose processor, or a specially programmed logic device. Input/Output (I/O) interface provides communication with different peripherals and is connected with CPU 1604, RAM 1628, ROM 1612, and mass storage device 1614, through bus 1610. Sample peripherals include display 1618, keyboard 1622, cursor control 1624, removable media device 1634, etc.

Display 1618 is configured to display the user interfaces described herein. Keyboard 1622, cursor control 1624, removable media device 1634, and other peripherals are coupled to I/O interface 1620 in order to communicate information in command selections to CPU 1604. It should be appreciated that data to and from external devices may be communicated through I/O interface 1620. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A robot system, comprising,
a cart frame;
an arm support frame fixed to the cart frame, the arm support frame is coupled to a robot arm used for servicing a semiconductor tool;
an arm frame extending from a first end to a second end, the first end is connected by hinges to the arm support frame and the second end has a fixture connect interface for connecting to a docking fixture of the semiconductor tool, the hinges enable the arm frame to rotate about the arm support frame; and
an arm locking mechanism is attached to the arm support frame for locking the arm frame when rotated to an extended position or a folded position;
wherein the fixture connect interface is configured to align the cart frame to the semiconductor tool when the arm frame is locked in the extended position, the alignment of the cart frame provides for corresponding alignment of the robot arm.

2. The robot system of claim 1, wherein the robot arm includes an end-effector connector that is configured to couple with one or more end-effectors, each end-effector is used for performing a specific servicing function.

3. The robot system of claim 1, wherein one of said end-effectors is a bolt interface, and said bolt interface is configured to programmatically install a plurality of bolts in accordance with a predefined pattern.

4. The robot system of claim 1, wherein one of said end-effectors is a cleaning attachment, and said cleaning attachment is configured to programmatically clean one or more components inside of a chamber of the semiconductor tool.

5. The robot system of claim 1, further comprising,
a computer integrated in said cart frame, the computer is coupled to one or more power supplies for powering the robot arm, and said computer is programmable to execute repeatable servicing routines.

6. The robot system of claim 1, further comprising,
a computer;
a robot controller;
an alternating current (AC) power supply and direct current (DC) power supply, the AC and DC power supplies are configured to power the computer and robot controller;
wherein said computer is programmable to execute repeatable servicing routines.

7. The robot system of claim 1, wherein said hinges include a top hinge and a bottom hinge, and said arm locking mechanism is disposed between the top hinge and the bottom hinge, and the first end of the arm frame includes a top arm rotating pivot coupled to the top hinge and a bottom arm rotating pivot coupled to the bottom hinge;
wherein said arm locking mechanism includes a lower mount fixture that is fixed to the bottom arm rotating pivot and an upper mount fixture that slides between an disengaged position and an engaged position, wherein the engaged position locks said arm frame in one of said extended position or said folded position.

8. The robot system of claim 7, wherein the upper mount fixture includes a pair of spherical locks that fit into extended groove locks of the lower mount fixture when the arm frame is locked into the extended position and fit into folded groove locks of the lower mount fixture when the arm frame is locked into the folded position.

9. The robot system of claim 8, wherein extended groove locks include side-walls for aligning the arm frame when locked in the extended position, and a slider plate of the arm locking mechanism combined with the side-walls assist in kinematic alignment of the arm frame.

10. The robot system of claim 7, wherein the upper mount fixture includes,
a slider plate attached to the arm support frame;
a connector plate mounted to the slider plate; and
a locking plate attached to a bottom end of the connector plate and disposed perpendicular to the connector plate, the pair of spherical locks is disposed on a bottom surface of the locking plate and are oriented opposite to one another.

11. The robot system of claim 7, wherein the extended groove locks are disposed orthogonal to the folded groove locks.

12. The robot system of claim 1, wherein the cart frame includes one or more storage for receiving one or more end-effectors used for performing a specific servicing function.

13. The robot system of claim 1, wherein the arm support frame is an A-frame.

14. A robot system, comprising,
a cart frame;
an arm frame extending from a first end to a second end, the first end is connected by hinges and the second end has a fixture connect interface for connecting to a docking fixture of a semiconductor tool, the hinges enable the arm frame to rotate horizontally, wherein a robot is connected at the second end of the arm frame; and
an arm locking mechanism for locking the arm frame when rotated to an extended position or a folded position;
wherein the fixture connect interface is configured to align the cart frame to the semiconductor tool when the arm frame is locked in the extended position and is connected to the docking fixture.

15. The robot system of claim 14, wherein the arm locking mechanism includes a locking plate attached to a slider plate by a connector plate, the locking plate includes a pair of spherical locks that engage with grooves in a base plate that connects to the arm frame, the grooves enable the arm locking mechanism to lock in the extended position or the folded position.

16. The robot system of claim 15, further including an arm support frame, the arm support frame is connected to the cart frame.

17. The robot system of claim 16, wherein the slider plate is fixed to the arm support frame.

18. The robot of claim 16, wherein the arm support frame is connected to a side of a top of the cart frame and the cart frame includes compute equipment for controlling the robot, the compute equipment is arranged in the cart frame to at least partially offset a tipping of gravity pull from the robot, the arm frame and the arm support frame.

19. A robot system, comprising,
a cart frame;
an arm support frame fixed to the cart frame, the arm support frame is coupled to a robot arm used for servicing a semiconductor tool;
an arm frame extending from a first end to a second end, the first end is connected by hinges to the arm support frame and the second end has a fixture connect interface for connecting to a docking fixture of the semiconductor tool, the hinges enable the arm frame to rotate horizontally about the arm support frame; and
an arm locking mechanism is attached to the arm support frame for locking the arm frame relative to the arm support frame when rotated and locked to an extended position or a folded position.

20. The robot system of claim 19, wherein the arm locking mechanism includes a locking plate attached to a slider plate by a connector plate, the slider plate is attached to the arm support frame, and the locking plate includes a pair of spherical locks that engage with grooves in a base plate that is connected to the arm frame at the first end, the grooves receive the pair of spherical locks to enable the arm locking mechanism to lock in the extended position or the folded position.

21. A robot system for servicing a process module, comprising,
a cart frame;
an arm frame extending from a first end to a second end, the first end is connected by hinges and the second end has a fixture connect interface for connecting to a docking fixture of the process module, the hinges enable the arm frame to rotate, wherein a robot is connected at the second end of the arm frame;
an arm locking mechanism for locking the arm frame when rotated to an extended position or a folded position, and the fixture connect interface is configured to align the cart frame to the process module when the arm frame is locked in the extended position and is connected to the docking fixture; and
a controller for operating the robot, the controller is configured run a program that instructs the robot to process a service operation, such that a robot arm of the robot is configured to articulate automated movements to complete the service operation, wherein the docking fixture provides a reference frame for the automated movements of the robot arm.

22. The robot system of claim 21, wherein the service operation is associated with removal of a top plate of the process module, and the removal of the top plate includes removal of a plurality of bolts using an end-effector of the robot arm.

23. The robot system of claim 21, wherein the service operation is associated with installation of a top plate of the process module, and the installation of the top plate includes insertion and tightening of a plurality of bolts using an end-effector of the robot arm, wherein the tightening of the plurality of bolts is carried out in accordance with a predefined sequence of tightening.

24. The robot system of claim 21, wherein the service operation is associated with cleaning an inside surface of the process module, wherein the robot arm includes a vision system for inspecting said inside surface as the robot arm performs the cleaning.

25. The robot system of claim 21, wherein the service operation is tracked using a plurality of sensors.

26. The robot system of claim 25, wherein the plurality of sensors produce sensor data that is processed using a machine learning algorithm to quantify attributes of the service operation.

27. The robot system of claim 21, wherein the controller is interfaced with a computer and the computer is coupled to a wired or wireless network for communicating data to a server before, during and after the service operation, the server is configured to store attributes regarding the service operation for trouble shooting.

* * * * *